(12) United States Patent
Koyanagi

(10) Patent No.: US 7,529,788 B2
(45) Date of Patent: May 5, 2009

(54) DIGITAL FILTER DESIGN METHOD AND DEVICE, DIGITAL FILTER DESIGN PROGRAM, AND DIGITAL FILTER

(75) Inventor: Yukio Koyanagi, Saitama (JP)

(73) Assignee: Neuro Solution Corp., Setagaya-ku, Tokyo (JP)

( * ) Notice: Subject to any disclaimer, the term of this patent is extended or adjusted under 35 U.S.C. 154(b) by 657 days.

(21) Appl. No.: 10/907,943

(22) Filed: Apr. 21, 2005

(65) Prior Publication Data

US 2005/0171989 A1    Aug. 4, 2005

Related U.S. Application Data

(63) Continuation of application No. PCT/JP03/13381, filed on Oct. 20, 2003.

(30) Foreign Application Priority Data

Oct. 21, 2002  (JP) ............... 2002-306315

(51) Int. Cl.
  *G06F 17/10*  (2006.01)
(52) U.S. Cl. .................................. 708/319
(58) Field of Classification Search ............ 708/319
  See application file for complete search history.

(56) References Cited

U.S. PATENT DOCUMENTS 6,871,207 B1 * 3/2005 Nanda et al. ............... 708/313

7,080,108 B1 * 7/2006 Acharya ..................... 708/316
2003/0105787 A1 * 6/2003 Jang et al. ................... 708/300

FOREIGN PATENT DOCUMENTS

| JP | 05-235701 | 9/1993 |
| JP | 05-243908 | 9/1993 |
| JP | 06-503450 | 4/1994 |
| JP | 06-326555 | 11/1994 |
| JP | 10-079686 | 3/1998 |

OTHER PUBLICATIONS

Digital Shingo Shori Handbook (Digital Signal Processing Handbook), edited by The Institute of Electronics, Information and Communication Engineers, pp. 112-121, Tokyo, Japan, Jan. 31, 1993, (with partial English translation of p. 112).

* cited by examiner

*Primary Examiner*—David H Malzahn
(74) *Attorney, Agent, or Firm*—Connolly Bove Lodge & Hutz LLP; Myron Keith Wyche

(57) ABSTRACT

A digital filter is designed by combining unit filters (L10', H10') having a predetermined asymmetric numerical sequence as filter coefficients (H1 to H3). Thus, it is possible to automatically obtain a desired digital filter coefficient only by combining the unit filter. Moreover, a symmetric numerical sequence $\{-1, 0, 9, 16, 9, 0, -1\}/32$ is divided at the center into two parts and one of them is used as the asymmetric filter coefficients (H1 to H3). This reduces the number of taps required for the digital filter designed, eliminates use of a window function, and prevents generation of a discretization error in the filter characteristic obtained.

48 Claims, 14 Drawing Sheets

|     | h1    | h2   | h3    | h4   | h5    |
|-----|-------|------|-------|------|-------|
| L10 | -1/32 | 9/32 | 16/32 | 9/32 | -1/32 |
| H10 | 1/32  | -9/32| 16/32 | -9/32| 1/32  |

| GENERATION OF L10 | | |
|----|----|----|
| -1 |    | -1 |
| 1  | -1 | 0  |
| 8  | 1  | 9  |
| 8  | 8  | 16 |
| 1  | 8  | 9  |
| -1 | 1  | 0  |
|    | -1 | -1 |

| GENERATION OF H10 | | |
|----|----|----|
| 1  |    | 1  |
| -1 | 1  | 0  |
| -8 | -1 | -9 |
| 8  | 8  | 16 |
| -1 | -8 | -9 |
| 1  | -1 | 0  |
|    | 1  | 1  |

$$\begin{array}{ccc} -1 & & -1 \\ 0 & & 0 \\ 1 & -1 & 0 \\ 0 & 0 & 0 \\ 8 & 1 & 9 \\ 0 & 0 & 0 \\ 8 & 8 & 16 \\ 0 & 0 & 0 \\ 8 & 8 & 9 \\ 0 & 0 & 0 \\ 1 & 1 & 0 \\ 0 & 0 & 0 \\ -1 & -1 & -1 \end{array}$$

| 1 | | 1 |
|---|---|---|
| 0 | | 0 |
| −1 | 1 | 0 |
| 0 | 0 | 0 |
| −8 | −1 | −9 |
| 0 | 0 | 0 |
| 8 | 8 | 16 |
| 0 | 0 | 0 |
| −1 | −8 | −9 |
| 0 | 0 | 0 |
| 1 | −1 | 0 |
| | 0 | 0 |
| | 1 | 1 |

F I G. 1 1 A
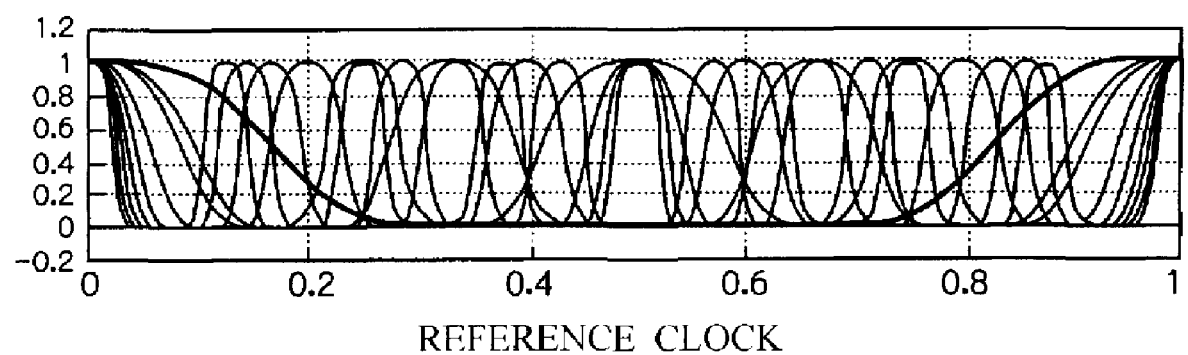
REFERENCE CLOCK
F I G. 1 1 B
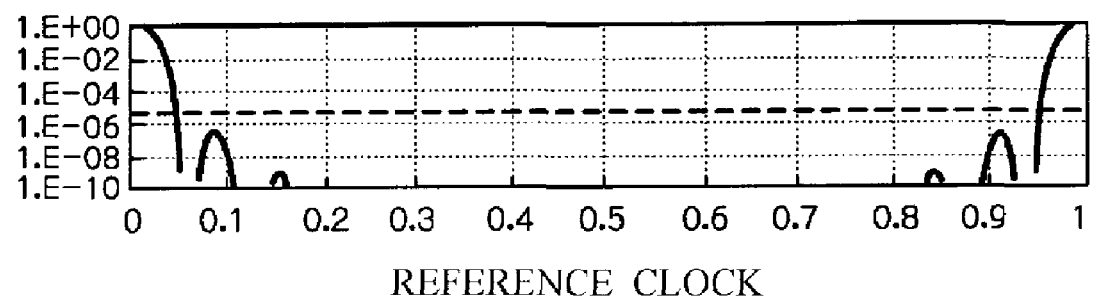
REFERENCE CLOCK

REFERENCE CLOCK

REFERENCE CLOCK

REFERENCE CLOCK

F I G. 1 3 A
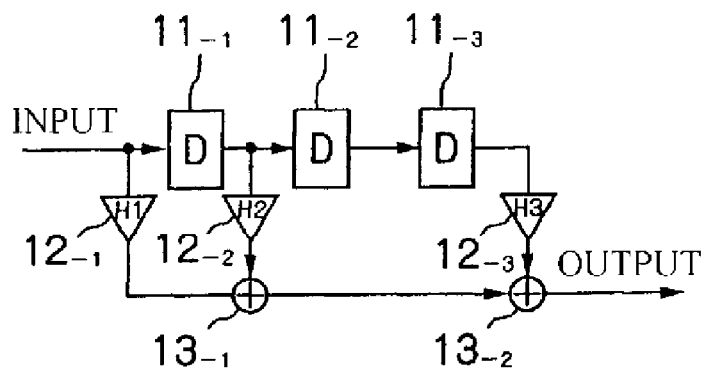
F I G. 1 3 B
|  | H1 | H2 | H3 |
|---|---|---|---|
| L10' | $8/16$ | $(9-N/8)/16$ | $-(1-N/8)/16$ |
| H10' | $8/16$ | $-(9-N/8)/16$ | $(1-N/8)/16$ |
F I G. 1 4
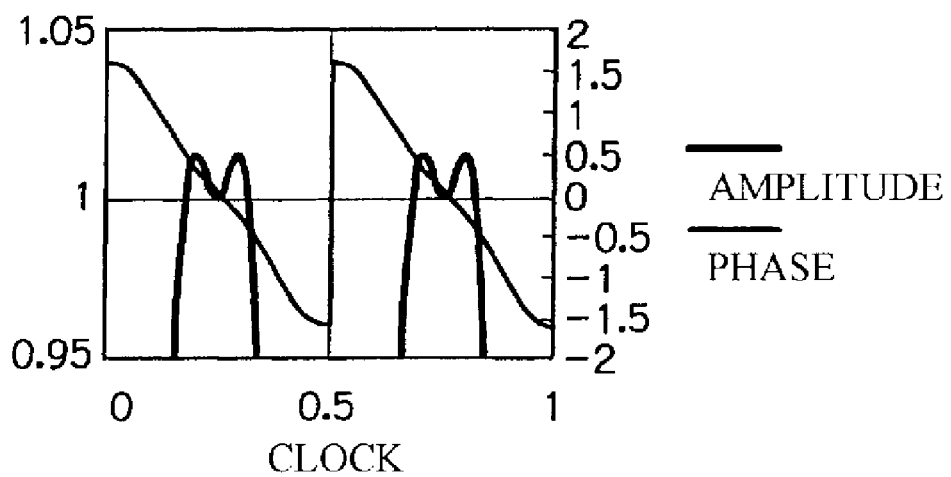

F I G. 1 5
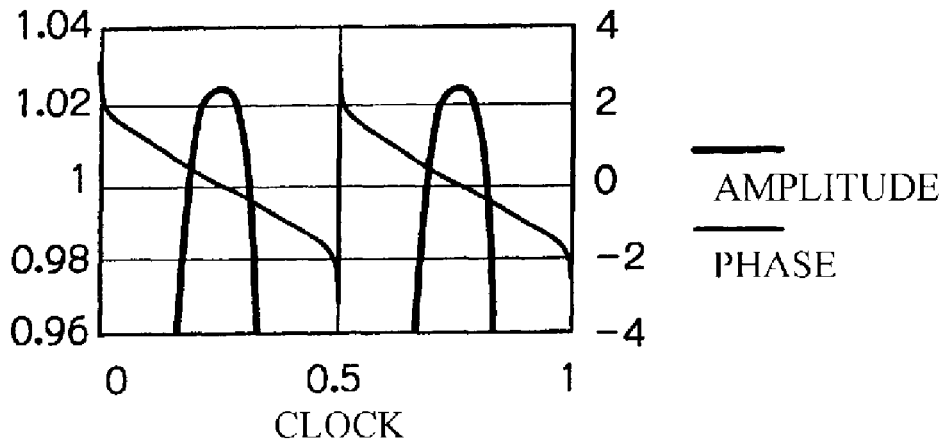
F I G. 1 6 A
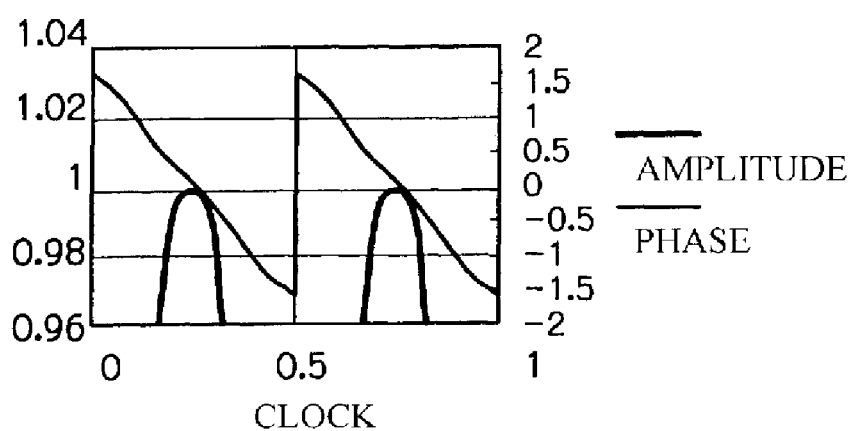
F I G. 1 6 B
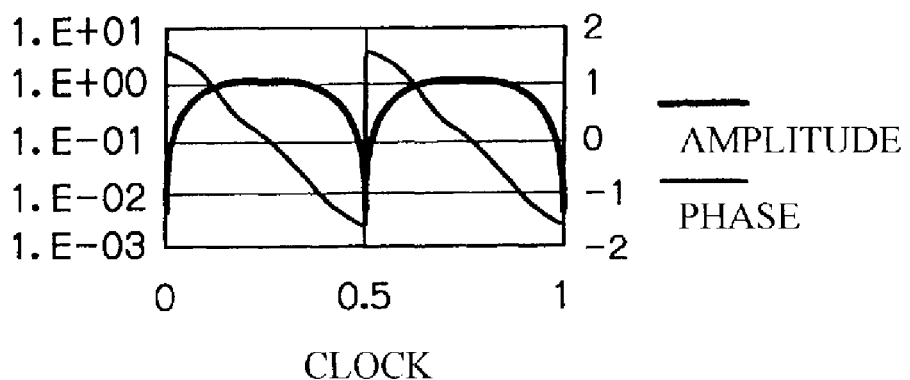

F I G. 1 7
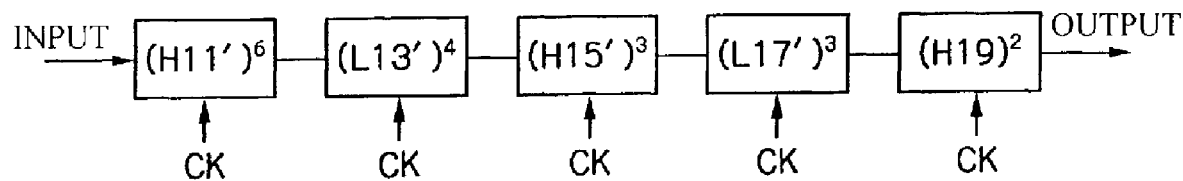
F I G. 1 8 A
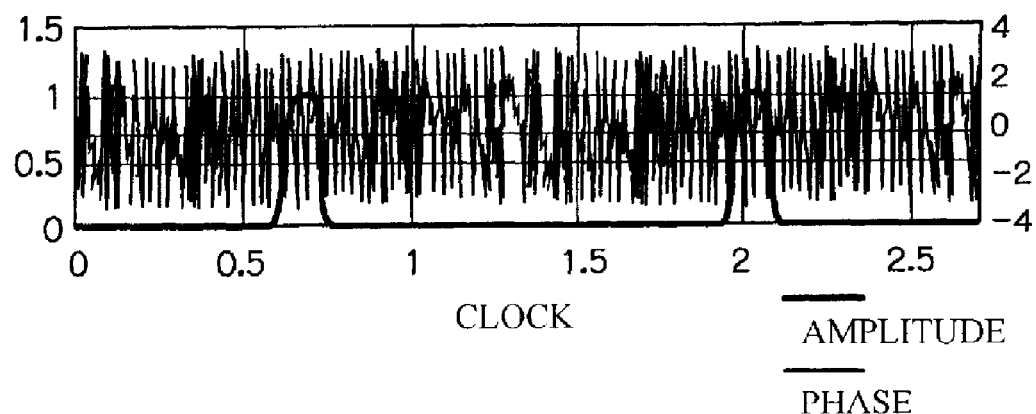
F I G. 1 8 B
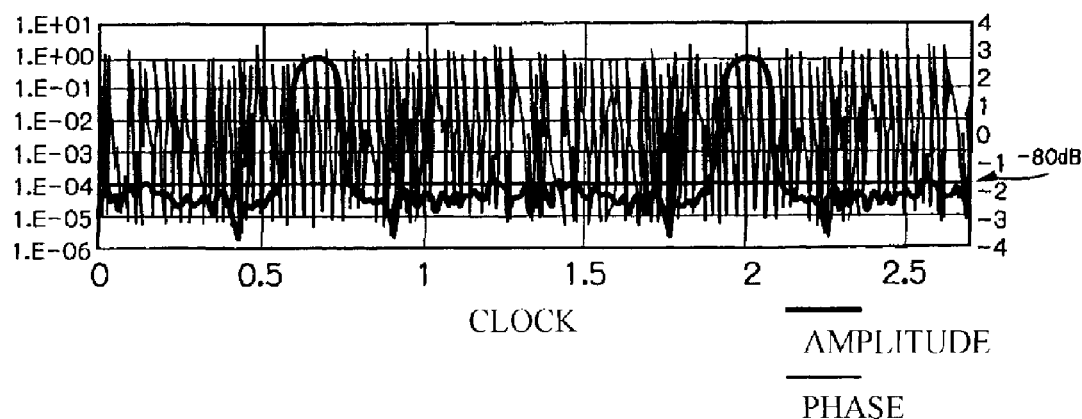

| | H1 | H2 | H3 | H4 | H5 | H6 |
|---|---|---|---|---|---|---|
| L10″ | $-(1-N/8)/16$ | $(9-N/8)/16$ | $8/16$ | $8/16$ | $(9-N/8)/16$ | $-(1-N/8)/16$ |
| H10″ | $(1-N/8)/16$ | $-(9-N/8)/16$ | $8/16$ | $8/16$ | $-(9-N/8)/16$ | $(1-N/8)/16$ |

FIG. 22A

| GENERATION OF L20 | | |
|---|---|---|
| -1<br>1<br>8<br>8<br>1<br>-1 | -1<br>1<br>8<br>8<br>1<br>-1 | 1<br>2<br>-15<br>0<br>78<br>132<br>78<br>0<br>-15<br>-2<br>1 |

FIG. 22B

| GENERATION OF H20 | | |
|---|---|---|
| -1<br>-1<br>8<br>-8<br>1<br>1 | -1<br>-1<br>8<br>-8<br>1<br>1 | -1<br>-2<br>15<br>0<br>-78<br>132<br>-78<br>0<br>15<br>-2<br>-1 |

DIGITAL FILTER DESIGN METHOD AND DEVICE, DIGITAL FILTER DESIGN PROGRAM, AND DIGITAL FILTER

BACKGROUND OF THE INVENTION

1. Field of the Invention

The present invention relates to a digital filter designing method and device, digital filter designing program and digital filter, and more particularly, to an FIR filter and a method of designing it, which comprises a tapped delay line made up of a plurality of delayers and performs multiplying signals of the respective taps several-fold and then adding up the results of multiplication and outputting the addition result.

2. Description of the Related Art

Some kind of digital signal processing is generally performed in various kinds of electronic devices provided in various fields of communication, measurement, sound/image signal processing, medical care, seismology, and so on. One of the most significant basic operation of the digital signal processing is filtering which extracts only a signal having a necessary frequency band from an input signal in which signal and noise are mixed. For this reason, digital filters are often used for electronic devices performing digital signal processing.

As the digital filter, an IIR (Infinite Impulse Response) filter and FIR (Finite Impulse Response) filter are often used. Of these digital filters, the FIR filter is a filter provided with tapped delay lines made up of a plurality of delayers, multiplies signals of the respective taps several-fold and adds up the results of multiplication and outputs the addition result, and has the following advantages. First, since extreme values of a transfer function of the FIR filter exist only at the origin of the z-plane, the circuit is always stable. Second, if filter coefficients are of a symmetric type, it is possible to realize a completely exact linear phase characteristic.

When filters are categorized from the standpoint of an arrangement of a pass band and a stop band, they are classified mainly into four categories of low-pass filters, high-pass filters, band pass filters and band elimination filters. The basic element for an IIR filter or FIR filter is a low-pass filter and other high-pass filter, band pass filter and band elimination filter are derived from the low-pass filter by carrying out processing such as frequency conversion.

By the way, the FIR filter uses impulse response expressed by a finite time length as a filter coefficient as is. Therefore, designing an FIR filter means determining filter coefficients so as to obtain a desired frequency characteristic.

Conventionally, when the low-pass filter as the basic element is designed, filter coefficients of an FIR filter with respect to the respective taps are obtained by carrying out convolutional calculations, etc., using a window function or Chebyshev approximation, etc., based on the ratio of a sampling frequency and a cutoff frequency. Then, a simulation is performed using the obtained filter coefficients to correct the coefficient values as appropriate while checking the frequency characteristic to thereby obtain a low-pass filter having a desired characteristic.

Furthermore, when the other filters such as high-pass filter, band pass filter, band elimination filter are designed, a plurality of low-pass filters as the basic elements are designed using the above described procedure first. Next, by carrying out operations such as frequency conversion by combining those low-pass filters, an FIR filter having a desired frequency characteristic is designed.

However, the filter frequency characteristic obtained using the conventional design method depends on the window function or Chebyshev approximation, and therefore if these are not set properly, it is not possible to obtain a satisfactory frequency characteristic. However, it is generally difficult to set a window function or approximate expression appropriately. That is, the above described conventional filter design method requires a skilled technician to design the filter at much expense in time and effort and has a problem that it is not possible to design an FIR filter with a desired characteristic easily.

Furthermore, even if it is possible to design an FIR filter having substantially a desired characteristic, the number of taps of the designed filter becomes enormous and the coefficient values become extremely complicated and random values. For this reason, there is a problem that a large-scale circuit structure (adders, multipliers) is required to realize such a number of taps and coefficient values. Furthermore, there is also a problem that when the designed FIR filter is actually used, the amount of calculation becomes very large and processing load becomes heavy.

The present invention has been implemented to solve such a problem and it is an object of the present invention to make it possible to easily design an FIR digital filter having a desired frequency characteristic.

Furthermore, it is another object of the present invention to provide an FIR digital filter capable of realizing a desired frequency characteristic with a small circuit scale and with a high degree of accuracy.

SUMMARY OF THE INVENTION

The digital filter design method of the present invention is characterized by carrying out a filter design using at least one of a first unit filter having basic filter coefficients of an asymmetric numerical sequence whose values are set in such a way that the total value of the numerical sequence is non-zero and the total values of every other values of the numerical sequence match and have the same sign, and a second unit filter having basic filter coefficients of an asymmetric numerical sequence whose values are set in such a way that the total value of the numerical sequence is zero and the total values of every other values of the numerical sequence match and have the opposite signs, and arbitrarily cascade connecting 0 or more such first unit filters and 0 or more such second unit filters.

Another mode of the present invention is characterized by carrying out a filter design using at least one of a first unit filter made up of a plurality of basic filters having asymmetric filter coefficients of a numerical sequence whose values are set in such a way that the total value of the numerical sequence is non-zero and the total values of every other values of the numerical sequence match and have the same sign, cascade connected so that the numerical sequence as a whole is symmetric, and a second unit filter made up of a plurality of basic filters having asymmetric filter coefficients of a numerical sequence whose values are set in such a way that the total value of the numerical sequence is zero and the total values of every other values of the numerical sequence match and have the opposite signs, cascade connected so that the numerical sequence as a whole is symmetric, and arbitrarily cascade connecting 0 or more such first unit filters and 0 or more such second unit filters.

A further mode of the present invention is characterized in that a pass frequency band of a filter is adjusted by inserting a delay of n clocks between taps corresponding to the asymmetric filter coefficients making up the first and second unit filters.

The digital filter according to the present invention comprises a tapped delay line made up of a plurality of delayers, characterized in that signals of the respective taps are multiplied several-fold according to the filter coefficients calculated using the filter design method according to the methods of the present invention, then added up the results of multiplication and output the addition result.

A still further mode of the present invention is characterized in that delay means for inserting delays of n clocks between taps corresponding to the asymmetric filter coefficients is constructed as follows. That is, the delay means is constructed by including a delay circuit which stores and outputs data input according to a second clock having a period 1/n times that of a reference clock.

As explained above, the present invention designs a digital filter by arbitrarily combining one or more unit filters having a predetermined asymmetric numerical sequence as filter coefficients, and can thereby automatically obtain coefficients of a digital filter having a desired frequency characteristic by only combining unit filters and allow even a non-expert technician to design a filter extremely simply.

Furthermore, according to the present invention, the above described asymmetric numerical sequence corresponds to one of two parts into which a predetermined symmetric numerical sequence is divided at the center and therefore requires only an extremely small number of taps necessary for the digital filter designed and requires only a small number of types of filter coefficients necessary for each tap output. Moreover, this eliminates use of a window function and prevents generation of a discretization error in the filter coefficients obtained. Therefore, it is possible to drastically reduce the number of circuit elements (multipliers in particular), reduce the circuit scale, reduce power consumption and alleviate the calculation load, etc., and realize a desired frequency characteristic of the digital filter at a high degree of accuracy. Furthermore, since the digital filter designed has an extremely simple structure made up of a repetition of the same pattern of a unit filter, it is possible to reduce man-hours for integration and facilitate the integration into an IC.

BRIEF DESCRIPTION OF THE DRAWINGS

FIGS. 11A and 11B are diagrams explaining the extractions of frequency bands;

FIGS. 13A and 13B are diagrams showing the circuit structure and numerical sequences of filter coefficients of two types of 3-tap unit filter which is most fundamental in the filter design method according to a first embodiment;

FIG. 14 is a diagram showing the frequency characteristic of a 3-tap high-pass unit filter H10' when a simple numerical sequence {8, −9, 0, 1}/16 is used as filter coefficients;

FIG. 15 is a diagram showing the frequency characteristic of a 3-tap high-pass unit filter H10' when only a filter coefficient H3 is adjusted;

FIGS. 16A and 16B are diagrams showing the frequency characteristic of the 3-tap high-pass unit filter H10' when filter coefficients H2, H3 are adjusted;

FIG. 17 is a diagram showing the circuit example of a band pass filter according to the first embodiment;

FIGS. 18A and 18B are diagrams showing the frequency characteristic of the band pass filter shown in FIG. 17;

FIGS. 22A and 22B are diagrams showing the filter coefficient generation algorithms of 5-tap unit secondary filters L20, H20.

DETAILED DESCRIPTION OF THE PREFERRED EMBODIMENTS

With reference now to the attached drawings, embodiments of the present invention will be explained below.

The digital filter of this embodiment is an FIR filter of such a type that includes tapped delay lines made up of a plurality of delayers, multiplies output signals of the respective taps several-fold according to given filter coefficients and then adds up the results of multiplication and outputs the addition result.

First Embodiment

A filter design method according to a first embodiment allows an FIR filter having a desired frequency characteristic to be designed by only creating two types of 3-tap unit filters L1n', H1n' which will be explained below and combining them. The suffix "n" to each numeral indicating the unit filter denotes the number of clocks of a delay to be inserted between taps, that is, the number of "0"s to be inserted between filter coefficients (which will be explained in detail later).

Figures 1A, 1B, 2A, 2B:
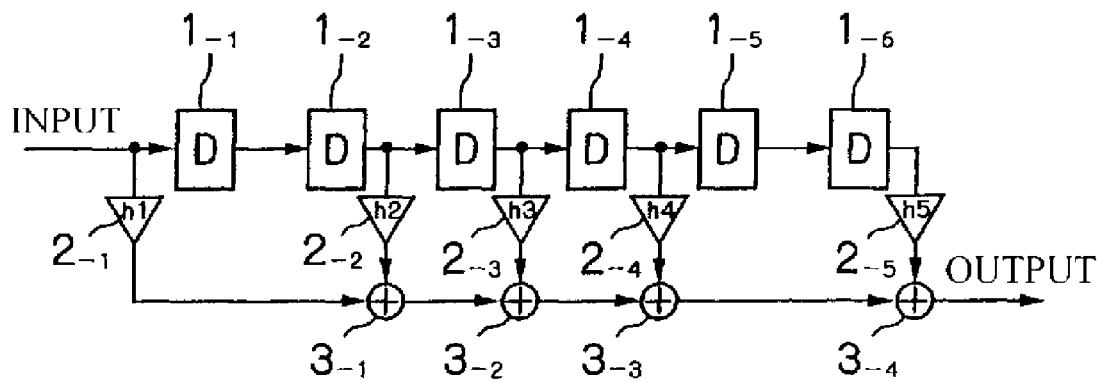
FIGS. 1A and 1B are diagrams showing the circuit structure and numerical sequences of filter coefficients of 5-tap unit filters L10, H10.
FIGS. 2A and 2B are diagrams showing the filter coefficient generation algorithms of the 5-tap unit filters L10, H10.

First, two types of 5-tap unit filters L1n, H1n which serve as a reference in understanding the above described two types of 3-tap unit filters L1n", H1n' will be explained. FIGS. 1A and 1B are diagrams showing the 5-tap unit filters L10, H10. FIG. 1A shows the circuit structure and FIG. 1B shows numerical sequences of filter coefficients.

As shown in FIG. 1A, the 5-tap unit filters L10, H10 delay an input signal sequentially by 1 clock CK at a time using six cascade-connected D-type flip flops $1_{-1}$ to $1_{-6}$. Then, the signals extracted from the predetermined taps of the respective D-type flip flops $1_{-1}$ to $1_{-6}$ are multiplied by filter coefficients h1 to h5 shown in FIG. 1B at five coefficient multipliers $2_{-1}$ to $2_{-5}$ respectively and all the multiplication results are added up using four adders $3_{-1}$ to $3_{-4}$ and output.

Both of the two types of 5-tap unit filters L10, H10 have the circuit structure shown in FIG. 1A and only the filter coefficients (multiplier values h1 to h5 of coefficient multipliers 2$_{-1}$ to 2$_{-5}$) are different as shown in FIG. 1B.

As is evident from FIG. 1B, the filter coefficients of the 5-tap low-pass unit filter L10 consist of an extremely simple numerical sequence {−1, 0, 9, 16, 9, 0, −1}/32 (however, the parts corresponding to values "0" have no tap output as shown in FIG. 1A and are not used as filter coefficients). Such filter coefficients have a symmetric numerical sequence and have such a nature that the total value of the numerical sequence is non-zero and the total values of every other values of the numerical sequences match and have the same sign (−1+9+9−1=16, 0+16+0=16).

On the other hand, the filter coefficients of the 5-tap high-pass unit filter H10 consist of an extremely simple numerical sequence {1, 0, −9, 16, −9, 0, 1}/32 (however, the parts corresponding to values "0" has no tap output and are not used as filter coefficients). Such filter coefficients have a symmetric numerical sequence and have such a nature that the total value of the numerical sequence is zero and the total values of every other values of the numerical sequences match and have the opposite signs (1−9−9+1=−16, 0+16+0=16).

Here, the meanings of the numerical sequences making up these filter coefficients will be explained using FIGS. 2 to 4.

FIGS. 2A and 2B are diagrams showing the method of generating numerical sequences making up filter coefficients of the 5-tap unit filters L10, H10. As shown in FIG. 2A, the numerical sequence making up the filter coefficients of the 5-tap low-pass unit filter L10 is obtained by calculating a moving average of a predetermined digital basic function whose data value changes as {−1, 1, 8, 8, 1, −1}/16 every one clock CK.

Furthermore, as shown in FIG. 2B, the numerical sequence making up the filter coefficients of the 5-tap high-pass unit filter H10 is obtained by calculating a moving average of a digital basic function whose data value changes as {1, −1, −8, 8, −1, 1}/16 every one clock CK and another digital basic function whose data value changes as {1, −1, 8, −8, −1, 1}/16 every one clock CK.

Figure 3A:
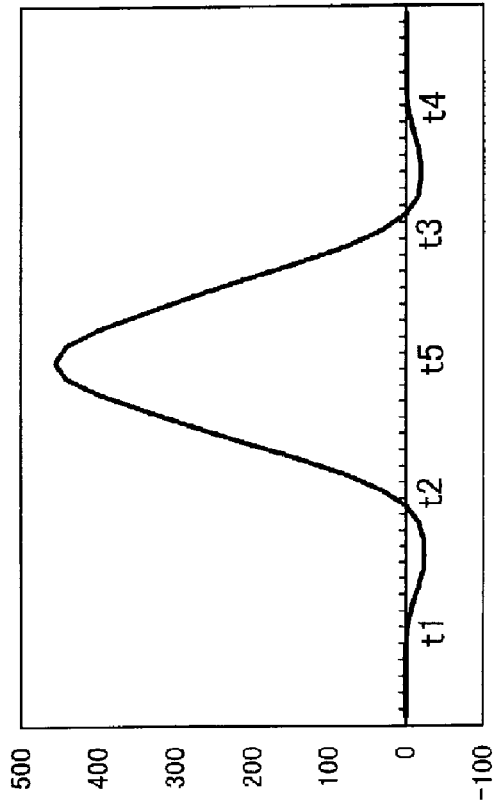
FIGS. 3A and 3B are diagrams explaining the meanings of filter coefficients of the 5-tap low-pass unit filter L10.
Figure 3B:
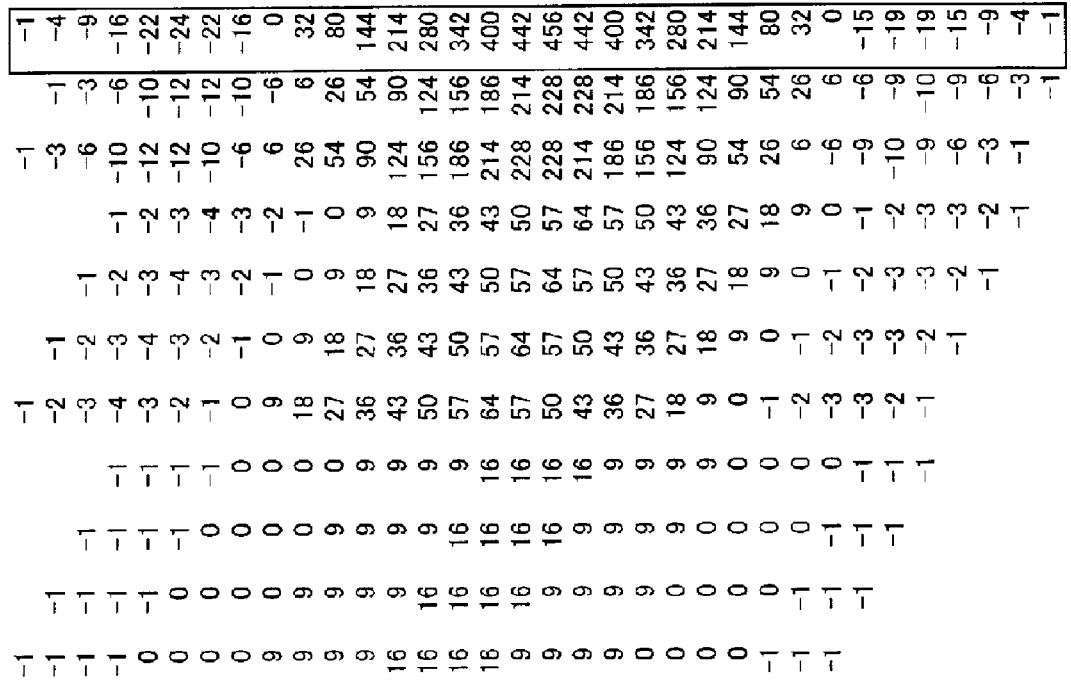

FIGS. 3A and 3B are diagrams explaining the result obtained by applying a quadruple oversampling and convolution calculation on the numerical sequence making up the filter coefficients of the 5-tap low-pass unit filter L10. Here, for simplicity of explanation, an example of applying an oversampling and convolution calculation to an integer numerical sequence {−1, 0, 9, 16, 9, 0, −1} which is the original numerical sequence multiplied 32-fold is shown.

In FIG. 3A, a series of numerical sequences shown on the leftmost column is a value resulting from applying a quadruple oversampling to the original numerical sequence {−1, 0, 9, 16, 9, 0, −1}. Furthermore, the numerical sequences corresponding to the four columns from the leftmost column toward the right are obtained by shifting the numerical sequence shown on the leftmost column downward one by one. The column direction in FIG. 3A indicates the time axis and shifting the numerical sequence downward corresponds to gradually delaying the numerical sequence shown on the leftmost column.

That is, the numerical sequence on the second column from the left indicates the numerical sequence obtained by shifting the numerical sequence shown on the leftmost column by a ¼ phase of a quadruple frequency clock 4CK. Furthermore, the numerical sequence shown on the third column from the left indicates the numerical sequence obtained by shifting the numerical sequence shown on the second column from the left by a ¼ phase of a quadruple frequency clock 4CK and the numerical sequence shown on the fourth column from the left indicates the numerical sequence obtained by shifting the numerical sequence shown on the third column from the left by a ¼ phase of a quadruple frequency clock 4CK.

Furthermore, the numerical sequence on the fifth column from the left corresponds to values obtained by adding up the respective numerical sequences on the first to fourth columns among the corresponding rows. Through the processing up to the fifth column from the left, quadruple oversampling involving a four-phase convolution calculation is executed in a digital form.

The numerical sequences corresponding to the four columns from the fifth column toward the right are obtained by shifting the numerical sequence shown on the fifth column downward one by one. Furthermore, the numerical sequence on the ninth column from the left corresponds to values obtained by adding up the respective numerical sequences on the fifth to eighth columns among the corresponding rows. Through this processing up to the ninth column from the left, quadruple oversampling involving a four-phase convolution calculation is executed twice in a digital form.

Furthermore, the numerical sequence on the tenth column from the left is obtained by shifting the numerical sequence shown on the ninth column downward by one. Furthermore, the numerical sequence on the 11th column from the left (rightmost column) corresponds to values obtained by adding up the respective numerical sequences on the ninth column and tenth column among the corresponding rows.

FIG. 3B shows in a graph the numerical sequence finally obtained on the rightmost column in FIG. 3A. The function having the waveform shown in this FIG. 3B has finite values other than "0" only when the sample position along the horizontal axis exists between t1 and t4 and all values in other areas are "0", that is, the function whose values converge to "0" at sample positions t1, t4. The case where values of a function take finite values other than "0" in local regions and take "0" in other regions is called "finite base".

Furthermore, the function shown in this FIG. 3B is a sampling function characterized in that a maximum value is taken only at the central sample position t5 and values are 0 at four sample positions of t1, t2, t3, t4 and the function passes through all sample points necessary to obtain smooth waveform data.

Figure 4A:
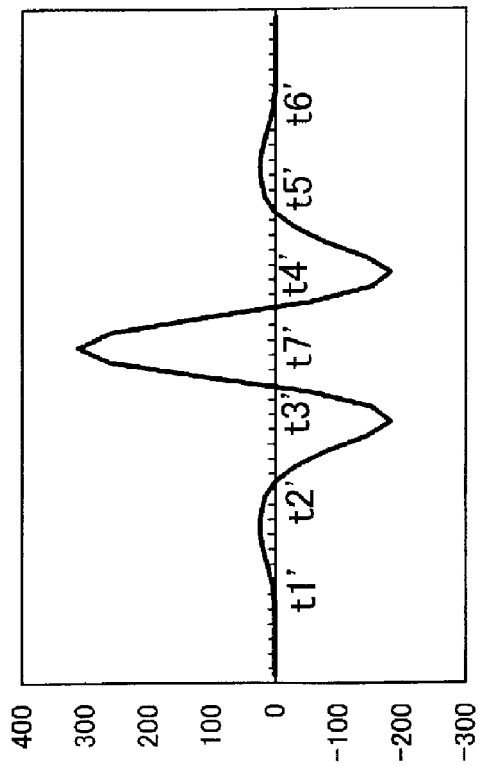
FIGS. 4A and 4B are diagrams explaining the meanings of filter coefficients of the 5-tap high-pass unit filter H10.
Figure 4B:
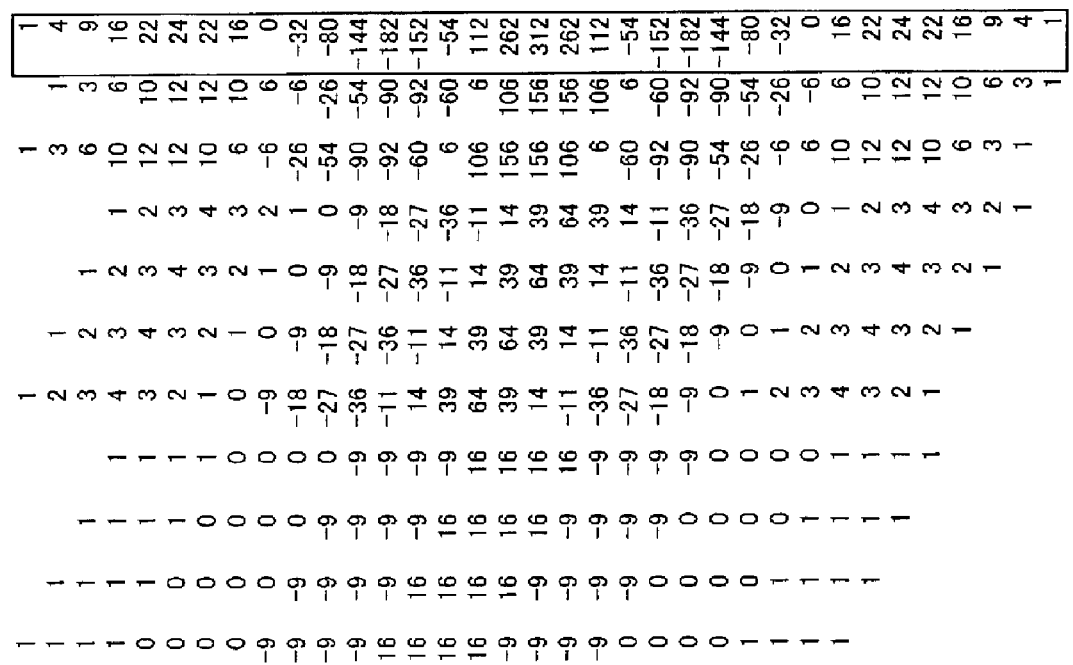

Next, FIGS. 4A and 4B are diagrams explaining the result of applying quadruple oversampling and convolution calculation to a numerical sequence making up filter coefficients of the 5-tap high-pass unit filter H10. Here, for clarity of explanation, an example is also shown in which an oversampling and convolution calculation are applied to an integer numerical sequence {1, 0, −9, 16, −9, 0, 1} obtained by multiplying the original numerical sequence 32-fold.

FIG. 4A shows a calculation process similar to that in FIG. 3A. The numerical sequence on the finally obtained rightmost column shown in this FIG. 4A is expressed in a graph shown in FIG. 4B. The function shown in this FIG. 4B is also a sampling function which takes a maximum value only at a central sample position t7' and is differentiable over the entire region one time and is a function of a finite base which converges to 0 at sample positions t1', t6'.

Figures 5, 6:
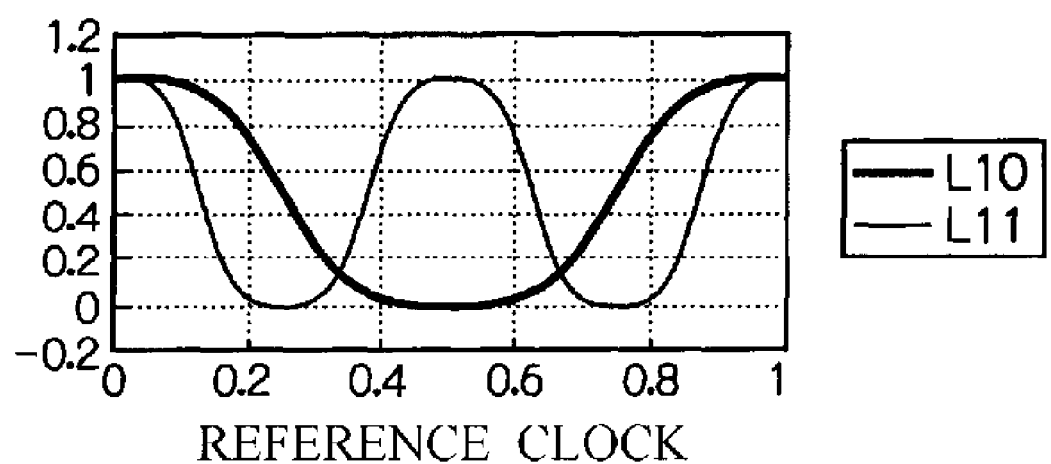
FIG. 5 is a diagram showing the filter coefficient generation algorithm of a 5-tap low-pass unit filter L11.
FIG. 6 is a diagram showing the frequency-gain characteristic of the 5-tap low-pass unit filters L10, L11.

Next, the case where the number of clocks n of delays inserted between taps is assumed to be n≧1 will be explained. FIG. 5 is a diagram showing the filter coefficients of a 5-tap low-pass unit filter L11 (when n=1). As shown in this FIG. 5, filter coefficients of a 5-tap low-pass unit filter L11 are generated by inserting one "0" between filter coefficients of the above described 5-tap low-pass unit filter L10.

Likewise, filter coefficients of a 5-tap low-pass unit filter L1n (n=2,3, ... ) are generated by inserting n "0"s between filter coefficients of the 5-tap low-pass unit filter L10.

FIG. 6 is a diagram showing the frequency-gain characteristics as a result of carrying out an FFT (Fast Fourier Transform) on the numerical sequences of the 5-tap low-pass unit filters L10, L11. Here, the gain and frequency are normalized by "1".

As is evident from this FIG. 6, the 5-tap low-pass unit filters L10, L11 have a gain of 0.5 at a central frequency and can provide good low-pass filter characteristics free of any overshoot in a low frequency region or ringing in a high frequency region. Furthermore, if the number of "0"s to be inserted between the filter coefficients is n, the frequency axis (period with respect to the frequency direction) of the frequency-gain characteristic is 1/n.

The numerical sequence in above FIG. 2A which is the basis for realizing such a low-pass filter characteristic also becomes the basis of the sampling function of the finite base shown in FIG. 3B. While a sampling function which is conventionally generally used converges to "0" at a sample position of t=±∞, the sampling function shown in FIG. 3B converges to "0" at finite sample positions of t=t1, t4.

For this reason, when the numerical sequence in FIG. 2A is FFT-transformed, only the data corresponding to the range from t=t1 to t4 is meaningful. This is not the case where the data corresponding to a region outside the range from t=t1 to t4 which should be originally taken into consideration is ignored, but the data need not be theoretically considered, and therefore no discretization error occurs. Therefore, using the numerical sequence shown in FIG. 2A as the filter coefficients eliminates the necessity for discretizing coefficients using a window function and can obtain a good low-pass filter characteristic.

Figures 7, 8:
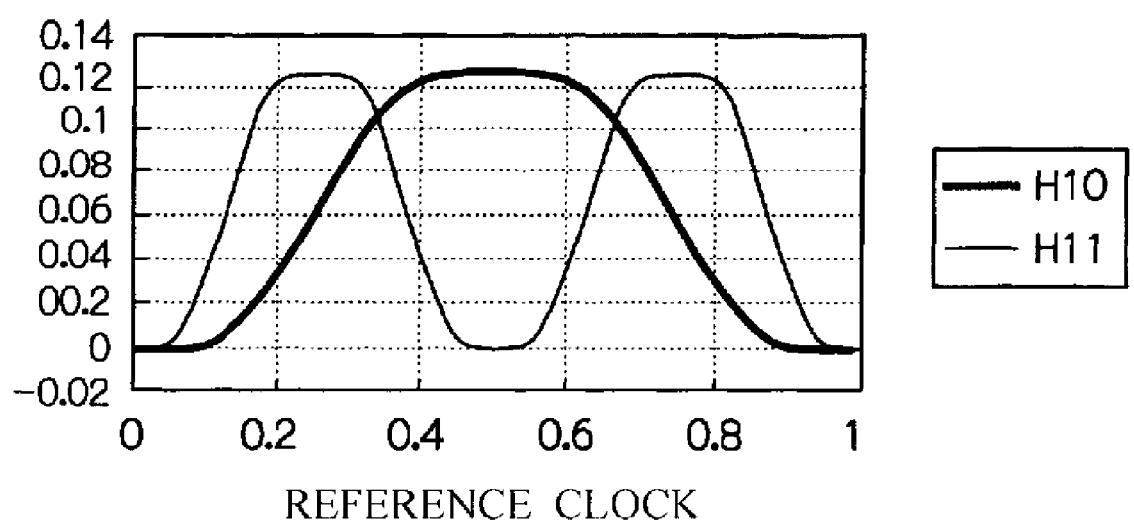
FIG. 7 is a diagram showing the filter coefficient generation algorithm of a 5-tap high-pass unit filter H11.
FIG. 8 is a diagram showing the frequency-gain characteristic of the 5-tap high-pass unit filters H10, H11.

FIG. 7 is a diagram showing the filter coefficients of a 5-tap high-pass unit filter H11. As shown in this FIG. 7, the filter coefficients of the 5-tap high-pass unit filter H11 are generated by inserting one "0" between the filter coefficients of the 5-tap high-pass unit filter H10.

Likewise, filter coefficients of a 5-tap high-pass unit filter H1n (n=2,3, ... ) are generated by inserting n "0"s between the filter coefficients of the 5-tap high-pass unit filter H10.

FIG. 8 is a diagram showing the frequency-gain characteristics of the 5-tap high-pass unit filters H10, H11. Here, the gain and frequency are also normalized by "1". As is evident from this FIG. 8, the gain is 0.5 at the central frequency of the 5-tap high-pass unit filters H10, H11 and it is possible to obtain a good high-pass filter characteristic free of any overshoot in a high frequency region or ringing in a low frequency region. Furthermore, if the number of "0"s to be inserted between the filter coefficients is n, the frequency axis (period with respect to the frequency direction) of the frequency-gain characteristic is 1/n.

The numerical sequence in above FIG. 2B which is the basis for realizing such a high-pass filter characteristic also becomes the basis of the sampling function of the finite base as shown in FIG. 4B. Therefore, using this numerical sequence as the filter coefficient eliminates the necessity for discretizing coefficients using a window function, and can thereby obtain a good high-pass filter characteristic.

Next, a cascade arrangement of 5-tap unit filters will be explained. A cascade arrangement of 5-tap unit filters causes coefficients of the respective unit filters to be multiplied and added up among themselves and new filter coefficients are thereby created. In the explanations below, when the number of cascade arrangement of 5-tap low-pass unit filters L10 is m, suppose this is described as $(L10)^m$.

Figure 9:
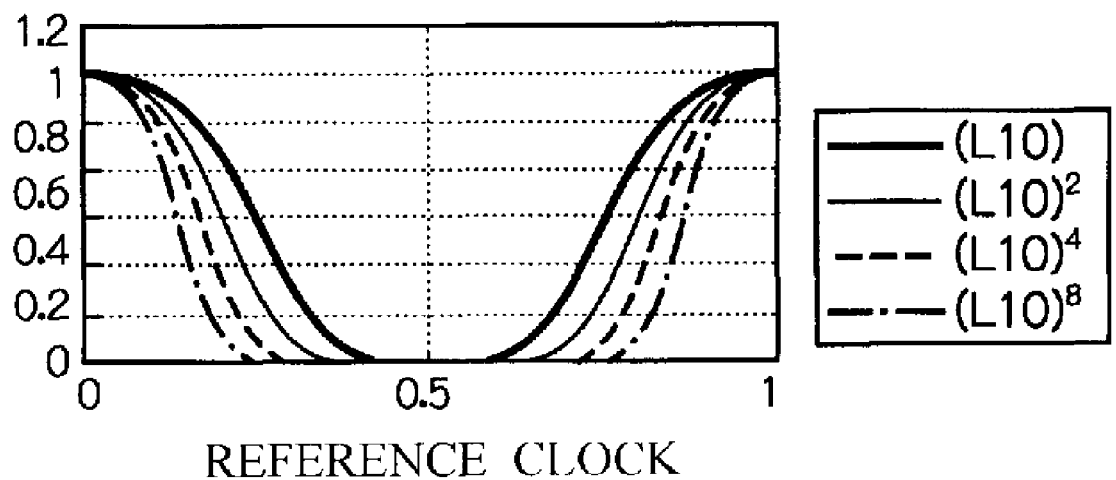
FIG. 9 is a diagram showing the frequency-gain characteristic of a 5-tap low-pass unit filter $(L10)^m$.

FIG. 9 is a diagram showing the frequency-gain characteristics of 5-tap low-pass unit filters L10, $(L10)^2$, $(L10)^4$ and $(L10)^8$. In this FIG. 9, the gain and frequency are also normalized by "1". When there is only one 5-tap low-pass unit filter L10, the clock at a position where the amplitude is 0.5 is 0.25. On the contrary, when the number of cascade arrangement m increases, the pass band width of the filter decreases. For example, when m=8, the clock at which the amplitude is 0.5 is 0.125.

Figure 10:
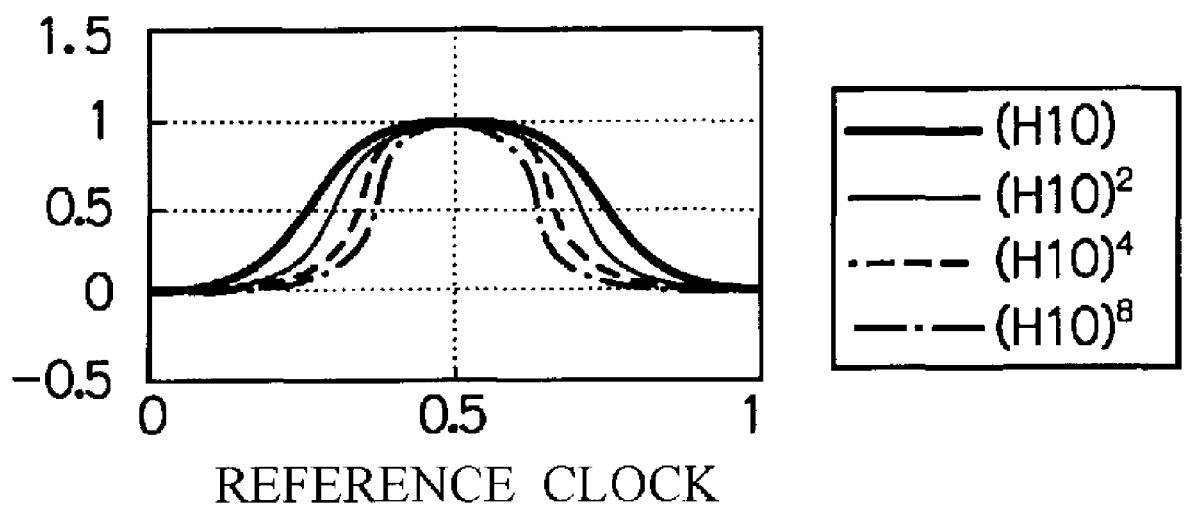
FIG. 10 is a diagram showing the frequency-gain characteristic of a 5-tap high-pass unit filter $(H10)^m$.

FIG. 10 is a diagram showing the frequency-gain characteristics of 5-tap high-pass unit filters H10, $(H10)^2$, $(H10)^4$ and $(H10)^8$. In this FIG. 10, the gain and frequency are also normalized by "1". When there is only one 5-tap high-pass unit filter H10, the clock at a position where the amplitude is 0.5 is 0.25. On the contrary, when the number of cascade arrangement m increases, the pass band width of the filter decreases. For example, when m=8, the clock at which the amplitude is 0.5 is 0.375.

Next, extractions of desired frequency bands will be explained. FIGS. 11A and 11B are diagrams explaining the extractions of frequency bands. Frequency bands are extracted using four or more above described cascade arranged unit filters. FIG. 11A shows frequency-gain characteristics of 5-tap low-pass unit filters $(L10)^4$, $(L11)^4$, $(L13)^4$ and $(L17)^4$ together in one graph. In this FIG. 11A, the gain and frequency are also normalized by "1".

Combining these plurality of types of 5-tap low-pass unit filters $(L10)^4$, $(L11)^4$, $(L13)^4$ and $(L17)^4$ causes the respective characteristic values to cancel out each other and extracts frequency bands. Furthermore, by combining these waveforms as the basis and moving them in the axial direction of inversion frequency if necessary, it is possible to create a filter whose pass band consists of only a desired frequency band.

FIG. 11B shows frequency characteristics obtained when these four types of 5-tap low-pass unit filters $(L10)^4$, $(L11)^4$, $(L13)^4$, $(L17)^4$ are cascade connected. According to this, it is possible to obtain a low-pass filter having a good attenuation characteristic whose pass band consists of an extremely narrow low frequency region. There is slight ringing, but this ringing occurs in regions of drops by −106 dB or more, and therefore the ringing can be substantially ignored.

Figure 12A:
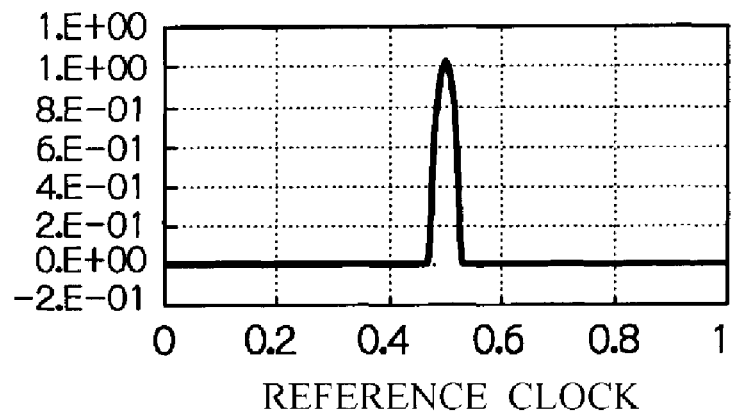
FIGS. 12A, 12B and 12C are diagrams showing other examples of extractions of frequency bands.
Figure 12B:
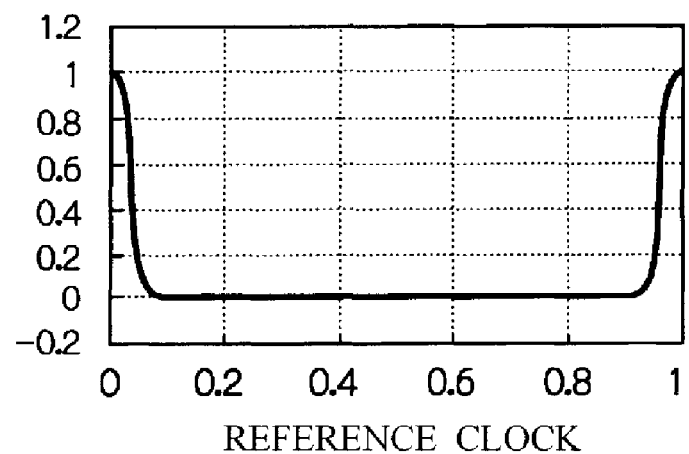
Figure 12C:
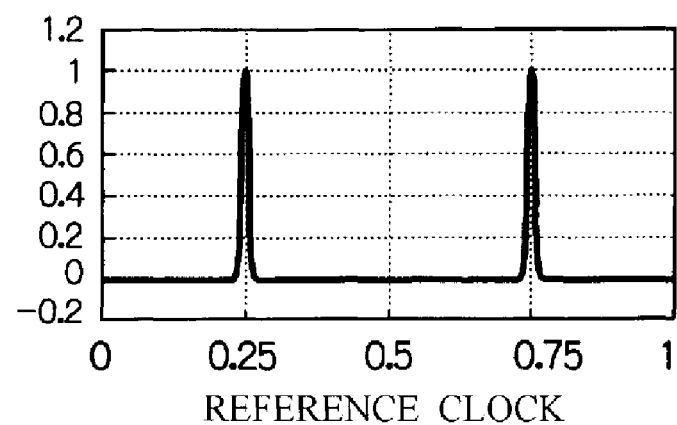

FIG. 12A to 12C are diagrams showing other examples of extractions of frequency bands. As shown in FIG. 12A, by combining 5-tap high-pass unit filter $(H10)^8$ and 5-tap low-pass unit filters $(L11)^8$, $(L13)^8$ and $(L17)^8$ and cascade connecting them, it is possible to obtain a high-pass filter whose pass band consists of a predetermined frequency band.

Furthermore, as shown in FIG. 12B, by combining 5-tap low-pass unit filters $(L10)^4$, $(L11)^8$ and $(L13)^4$ and cascade connecting them, it is possible to obtain a low-pass filter whose pass band consists of a predetermined frequency band. Furthermore, as shown in FIG. 12C, by combining the 5-tap high-pass unit filter $(H11)^8$ and 5-tap low-pass unit filters $(L13)^4$, $(L17)^4$ and $(L115)^8$ and cascade connecting them, it is possible to obtain a band pass filter whose pass band consists of a predetermined frequency band.

As shown above, using a 5-tap unit filter having a predetermined basic numerical sequence as filter coefficients and by arbitrarily combining them, it is possible to automatically generate filter coefficients of an FIR filter having a desired frequency characteristic by only combining unit filters. Therefore, the filter design method is simple and easily understandable and allows even a non-expert technician to design a filter extremely simply.

Furthermore, only an extremely small number of taps are required for the filter circuit designed by applying the above described technique and only a small number of types of filter coefficients are required for each tap output, and it is thereby possible to considerably simplify the structure of the calculation section of the filter circuit. Therefore, it is possible to drastically reduce the number of circuit elements (multipliers in particular), reduce the filter circuit scale, reduce power consumption and alleviate the calculation load, etc.

Furthermore, since the filter circuit designed by applying the above described technique has an extremely simple structure made up of a repetition of the same pattern, this filter circuit has a merit that it is possible to reduce man-hours for integration and facilitate the integration into an IC. Furthermore, in the characteristic aspect, it is possible to make quite a large improvement to the cutoff characteristic and also obtain a phase characteristic with a linear and excellent filter characteristic.

The contents explained so far have already been applied for a patent by the present applicant (Japanese Patent Application No. 2001-321321). This embodiment has further improved the contents of this application and is intended to allow an FIR filter having a desired frequency characteristic to be designed by only combining two types of 3-tap unit filters $L1n'$, $H1n'$ as described above. The filter coefficients of the above described 3-tap unit filters $L1n'$, $H1n'$ are obtained by dividing the numerical sequence with filter coefficients of the above described 5-tap unit filters $L1n$, $H1n$ into two parts at the center and then further adjusting one of the two parts.

FIGS. 13A and 13B are diagrams showing the 3-tap unit filters $L10'$, $H10'$. FIG. 13A shows the circuit structure and FIG. 13B shows their numerical sequences of filter coefficients. As shown in FIG. 13A, the 3-tap unit filters $L10'$, $H10'$ delay an input signal sequentially by 1 clock CK at a time using three cascade connected D-type flip flops $11_{-1}$ to $11_{-3}$. Then, the signals extracted from the predetermined taps of the respective D-type flip flops $11_{-1}$ to $11_{-3}$ are multiplied by filter coefficients H1 to H3 shown in FIG. 13B at three coefficient multipliers $12_{-1}$ to $12_{-3}$ respectively and all the multiplication results are added up using two adders $13_{-1}$ and $13_{-2}$ and output the addition result.

Both of the two types of 3-tap unit filters $L10'$, $H10'$ have the circuit structure shown in FIG. 13A and only the filter coefficients (multiplier values H1 to H3 of coefficient multipliers $12_{-1}$ to $12_{-3}$) are different as shown in FIG. 13B.

The filter coefficients of the 3-tap low-pass unit filter $L10'$ have an asymmetric numerical sequence and have such a nature that the total value of the numerical sequence is non-zero and the total values of every other values of the numerical sequences match and have the same sign. Furthermore, the filter coefficients of the 3-tap high-pass unit filter $H10'$ have an asymmetric numerical sequence and have such a nature that the total value of the numerical sequence is zero and the total values of every other values of the numerical sequences match and have the opposite signs.

Thus, the filter coefficients of these 3-tap unit filters $L10'$, $H10'$ have the same nature as the above described 5-tap unit filters $L10$, $H10$ except that they are of an asymmetric type. However, they have relatively more complicated values than the filter coefficients of the 5-tap unit filters $L10$, $H10$. The reasons for this will be explained below.

FIG. 14 is a diagram showing the frequency characteristics when filter coefficients $\{1, 0, -9, 16, -9, 0, 1\}/32$ of the 5-tap high-pass unit filter H10 are divided into two parts at the center and a simple numerical sequence $\{8, -9, 0, 1\}/16$ corresponding to one of them is used as filter coefficients (however, the parts whose value is "0" have no tap output and are not used as filter coefficients). Here, the gain and frequency are normalized by "1".

As shown in this FIG. 14, if one of two parts into which the numerical sequence of the 5-tap high-pass unit filter H10 is simply divided is used as filter coefficients, peaks of the parts which become pass bands in the frequency characteristic undulate and produce maximum values and those maximum values exceed "1". A unit filter having such a frequency characteristic is not suitable for a system which designs a desired FIR filter by cascade connecting these unit filters.

Therefore, the above described simple numerical sequence $\{8, -9, 0, 1\}/16$ is adjusted. First, the absolute value of the filter coefficient H3 which determines the frequency characteristic on the high frequency side is reduced. That is, the coefficient value is changed from "1" to "1−N/8" (any one of N=1,2, . . . 8) and the high frequency component is reduced so that only the center of the pass band becomes a maximum value of the gain.

FIG. 15 is a diagram showing the frequency characteristic of the filter coefficient H3 when N=3. As is evident from this FIG. 15, the undulation of the pass band is improved and only the central part becomes a maximum value of the gain. However, the maximum value still exceeds "1". Thus, the coefficient value is further adjusted so that the maximum value of the gain just becomes "1".

The maximum value can be adjusted using the filter coefficient H2 whose sign is opposite to the sign of the filter coefficient H3 used to adjust the high frequency component. Here, the absolute value of the value of the filter coefficient H2 is reduced from "−9" to "−(9−N/8)" (any one of N=1, 2, . . . 8).

At this time, the value of N for gain adjustment (value of N of filter coefficient H2) is matched with the above described value of N for high frequency adjustment so that the total value of the adjusted numerical sequence becomes the same as the total value of the numerical sequence before adjustment (before adjustment: 8−9+0+1=0, after adjustment: 8−(9−N/8)+0+(1−N/8)=0). Furthermore, the total value of every other values of the numerical sequence is also adjusted so that it does not change before and after adjustment.

FIGS. 16A and 16B are diagrams showing the frequency characteristics of the filter coefficients H2, H3 when N=3, FIG. 16A indicates the gain on a linear scale and FIG. 16B indicates the gain on a logarithmic scale. In this FIG. 16, the gain and frequency are also normalized by "1".

As is evident from this FIG. 16, when the filter coefficients H2, H3 are adjusted, there is no undulation in the pass band and only the central part becomes the maximum value of the gain and the maximum value just becomes "1". Furthermore, there is also a satisfactory amount of attenuation of approximately −55 dB. The 3-tap high-pass unit filter $H10'$ having such a frequency characteristic is suitable for a system which designs a desired FIR filter with these 3-tap high-pass unit filters $H10'$ cascade connected.

Furthermore, by inserting n "0"s between the filter coefficients of the 3-tap high-pass unit filter $H10'$ as in the case of the above described 5-tap high-pass unit filter H1n (n=1, 2, . . . ), it is possible to generate a 3-tap high-pass unit filter $H1n'$.

In the same way as for the above described 3-tap high-pass unit filter $H10'$, it is also possible to adjust filter coefficients of the 3-tap low-pass unit filter $L10'$ as appropriate. That is, as opposed to a numerical sequence $\{8, 9, 0, -1\}/16$ obtained by simply dividing the numerical sequence of the 5-tap low-pass unit filter L10 into two parts, the absolute value of the value of the filter coefficient H3 which determines the frequency characteristic on the high frequency side is reduced from "−1" to "−(1−N/8)".

Furthermore, the maximum value of the gain is adjusted using the filter coefficient H2 having a sign opposite to the sign of this filter coefficient H3. That is, the value of the filter coefficient H2 is reduced from "9" to "9−N/8". At this time, the value of N for high frequency adjustment is matched with the value of N for gain adjustment so that the total value of the adjusted numerical sequence becomes equal to the total value of the numerical sequence before adjustment (before adjustment: 8+9+0−1=16, after adjustment: 8+(9−N/8)+0−(1−N/8)=16). Furthermore, it is also adjusted so that the total value of every other values of the numerical sequence remains unchanged before and after adjustment.

Thus, even when the filter coefficient values of the 3-tap low-pass unit filter L10' are adjusted, it is possible to obtain a low-pass filter characteristic so that there is no undulation in the pass band and only the central part becomes a maximum value of the gain and the maximum value just becomes "1". The 3-tap low-pass unit filter L10' having such a frequency characteristic is also suitable for a system which designs a desired FIR filter by cascade connecting these 3-tap low-pass unit filters L10'.

Furthermore, in the same way as for the above described 5-tap low-pass unit filter L1n (n=1, 2, ...), by inserting n "0"s between the filter coefficients of the 3-tap low-pass unit filter L10', it is possible to generate a 3-tap low-pass unit filter L1n'.

As described above, by combining two types of 3-tap unit filters L10', H10' structured as shown in above FIG. 13 as appropriate and cascade connecting them, it is possible to simply design an FIR filter having a desired frequency characteristic in the same way as when the 5-tap unit filters L10, H10 are combined.

Here, the filter coefficients of the 3-tap unit filters L10', H10' may also be generated by adjusting a numerical sequence {−1, 0, 9, 8}/16, {1, 0, −9, 8}/16 which is one of two parts into which the numerical sequence of the filter coefficients of the 5-tap unit filter L10, H10 is divided at the center.

Next, a design example of a band pass filter using the above described 3-tap unit filters L10', H10' will be explained. Suppose the target specification of the band pass filter designed is as follows. That is, the central frequency Fc of the band pass filter is 675 KHz, sampling frequency Fs of the signal is 2.7 MHz (Fs=4*Fc), the band width of −3 dB is 100 KHz, band width of −80 dB is 200 KHz and attenuation amount of out-of-band is −80 dB or more.

FIG. 17 is a diagram showing the circuit example of the band pass filter which realizes this target specification. The circuit shown in FIG. 17 is constructed of six 3-tap high-pass unit filters H11', four 3-tap low-pass unit filters L13', three 3-tap high-pass unit filters H15', three 3-tap low-pass unit filters L17' and two 5-tap high-pass unit filters H19 cascade connected in that order.

FIGS. 18A and 18B are diagrams showing the frequency characteristics of the band pass filters shown in FIG. 17, FIG. 18A indicates the gain on a linear scale and FIG. 18B indicates the gain on a logarithmic scale. As is evident from FIG. 18, the band pass filter shown in FIG. 17 satisfies the above described target specification. Here, the 3-tap unit filters L1n', H1n' have an asymmetric numerical sequence of filter coefficients, and therefore these unit filters alone cannot guarantee the linearity of phase as shown in FIG. 16. However, when many of them are cascade connected as shown in FIG. 17, distortion of phase cancels out each other and improves the phase characteristic more or less as shown in FIG. 18.

As is evident from these FIG. 17 and FIG. 18, according to the filter design method of this embodiment, based on 3-tap unit filters L1n', H1n' with fewer taps, it is possible to obtain a band pass filter with a desired characteristic in an extremely simple structure with these filters cascade connected. The number of taps required as a whole is only 51 taps per bit.

That is, filter coefficients of this band pass filter are generated based on the function of the above described finite base and coefficient values become as small as negligible near both sides of the cascade arrangement. From the nature of the finite base, no discretization error occurs even if this part is ignored, and therefore this part is excluded. The excluded remaining part becomes final filter coefficients obtained for the band pass filter that satisfies the target specification.

Therefore, these filter coefficients need to be actually constructed by hardware and the number of taps required for this is only 51. This can reduce the number of taps required as a whole and simplify the structure of the filter circuit considerably compared to the case where only 5-tap unit filters L1n, H1n are used.

Here, an example of designing band pass filters using 3-tap unit filters L1n', H1n' has been explained, but it is also possible to design a high-pass filter, low-pass filter and band elimination filter, etc., using the same technique.

Second Embodiment

A second embodiment of the present invention will be explained. In the above described first embodiment, as filter coefficients of the 3-tap low-pass unit filter L10', those obtained by dividing a numerical sequence {−1, 0, 9, 16, 9, 0, −1}/32 making up filter coefficients of the 5-tap low-pass unit filter L10 into two parts and then adjusting a numerical sequence {8, 9, 0, −1}/16 which is one of them are used.

Furthermore, as filter coefficients of the 3-tap high-pass unit filter H10' those obtained by dividing a numerical sequence {1, 0, −9, 16, −9, 0, 1}/32 making up filter coefficients of the 5-tap high-pass unit filter H10 into two parts and then adjusting a numerical sequence {8, −9, 0, 1}/16 which is one of them are used. Since filter coefficients of both of these 3-tap unit filters L10', H10' are of an asymmetric type, phase linearity is not guaranteed as described above.

In contrast, the second embodiment is designed to realize a linear phase characteristic while using a 3-tap unit filter capable of reducing the number of taps.

Figures 19A, 19B:
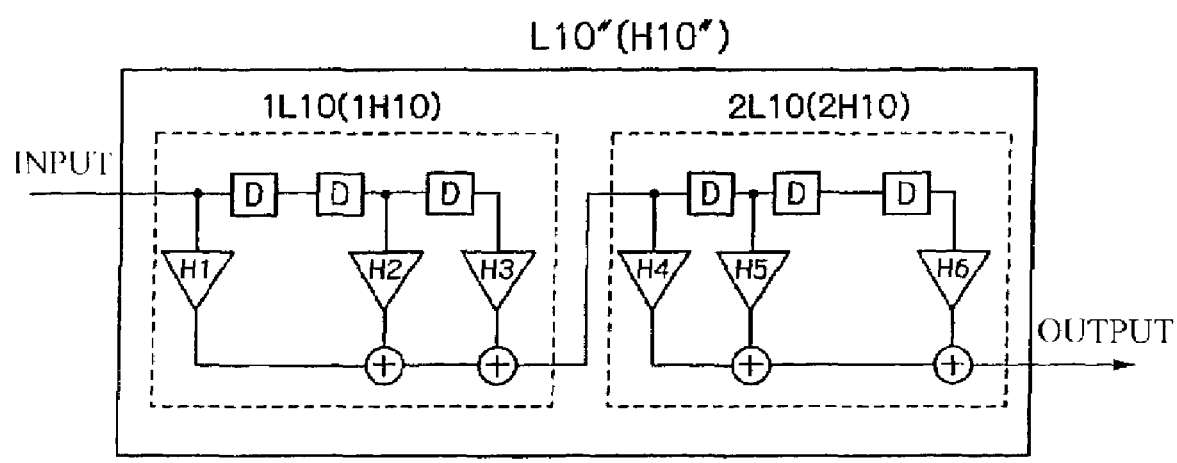
FIGS. 19A and 19B are diagrams showing the circuit structure and numerical sequences of filter coefficients of unit filters L10", H10" according to a second embodiment.

FIGS. 19A and 19B are diagrams showing the unit filter L10", H10" according to the second embodiment, FIG. 19A shows the circuit structure and FIG. 19B shows numerical sequences of filter coefficients.

As shown in FIG. 19A, both the unit filters L10", H10" of this embodiment have similar structures. That is, the low-pass unit filter L10" is constructed of two 3-tap low-pass unit filters 1L10, 2L10 cascade connected. Furthermore, the high-pass unit filter H10" is constructed of two 3-tap high-pass unit filters 1H10, 2H10 cascade connected.

As shown in FIG. 19B, the 3-tap low-pass unit filter 2L10 which is one component of the low-pass unit filter L10" uses filter coefficients H4 to H6 obtained by dividing the numerical sequence {−1, 0, 9, 16, 9, 0, −1}/32 of the above described 5-tap low-pass unit filter L10 into two parts and further adjusting the numerical sequence {8, 9, 0, −1}/16 which is one of them. This is the same as the 3-tap low-pass unit filter L10' explained in the first embodiment. Furthermore, the other 3-tap low-pass unit filter 1L10 uses filter coefficients H1 to H3 obtained by further adjusting the numerical sequence {−1, 0, 9, 8}/16 which is the other part of the above described numerical sequence divided into two parts.

Furthermore, the 3-tap high-pass unit filter 2H10 which is one component of the high-pass unit filter H10" uses filter coefficients H4 to H6 obtained by dividing the numerical sequence {1, 0, −9, 16, −9, 0, 1}/32 of the filter coefficients of the above described 5-tap high-pass unit filter H10 into two parts and further adjusting the numerical sequence {8, −9, 0, 1}/16 which is one of them. This is the same as the 3-tap high-pass unit filter H10' explained in the first embodiment. Furthermore, the other 3-tap high-pass unit filter 1H10 uses filter coefficients H1 to H3 obtained by further adjusting the numerical sequence {1, 0, −9, 8}/16 which is the other part of the numerical sequence divided into two parts.

The connection relationship between the above described two 3-tap low-pass unit filters 1L10, 2L10 and the connection relationship between the above described two 3-tap high-pass unit filters 1H10, 2H10 may also be right-and-left opposite to that shown in FIG. 19A.

Figure 20:
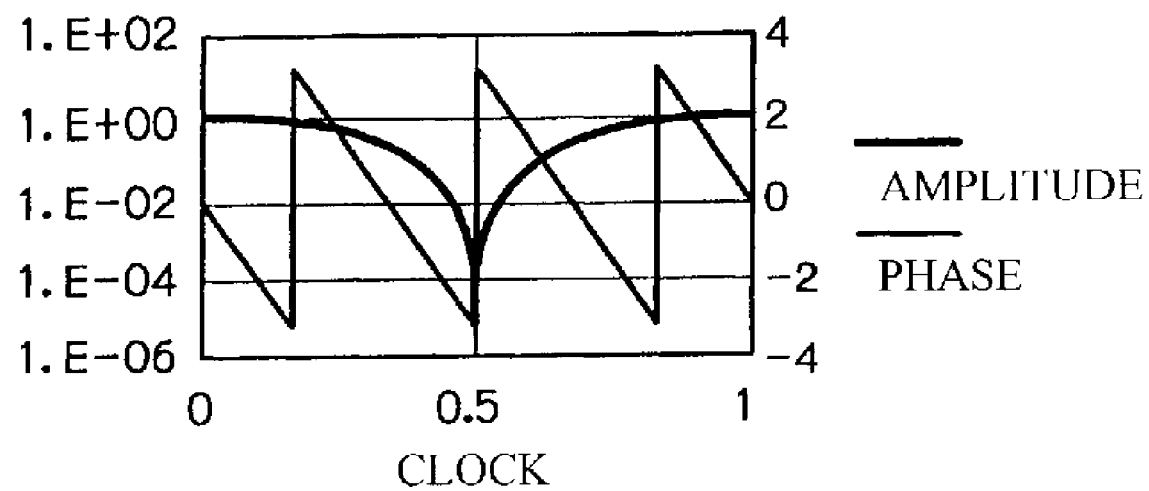
FIG. 20 is a diagram showing the frequency characteristic of the low-pass unit filter L10" according to the second embodiment.
Figure 21:
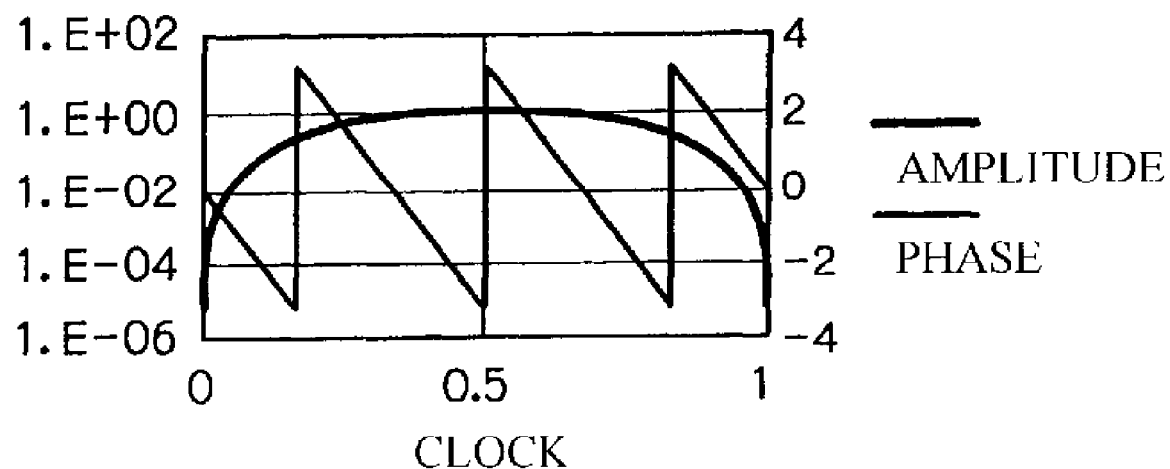
FIG. 21 is a diagram showing the frequency characteristic of the high-pass unit filter H10" according to the second embodiment.

When the unit filters L10", H10" are constructed as shown above, the filter coefficients become symmetric and therefore the phase characteristic becomes linear. FIG. 20 is a diagram showing the frequency characteristic of the low-pass unit filter L10" and FIG. 21 is a diagram showing the frequency characteristic of the high-pass unit filter H10" and express the gain on a logarithmic scale. In these FIG. 20 and FIG. 21, the gain and frequency are also normalized by "1".

As is evident from these figures, there is no undulation in the pass band in the frequency-gain characteristics and a maximum value is exactly set to "1". Furthermore, an amount of attenuation obtained is as good as approximately −55 dB. Furthermore, the frequency-phase characteristic has an excellent linear phase characteristic. Therefore, by cascade connecting the unit filters L1n", H1n" having such a frequency characteristic as described in the first embodiment, it is possible to construct a linear phase filter having symmetric coefficients with a very small number of taps.

Here, the unit filters L10", H10" shown in FIG. 19 are provided with 6 taps in total and have more taps than the 5-tap units L10, H10. However, while the 5-tap units L10, H10 are constructed of one stage, the unit filters L10", H10" are constructed of two 3-tap unit filters cascade connected. Therefore, the band width is already narrower than that of the 5-tap units L10, H10.

Therefore, the second embodiment is particularly effective when an FIR filter having a narrower band width is designed. That is, it is possible to drastically reduce the number of cascade connected unit filters necessary to realize a desired narrow band width as a whole compared to the case where the 5-tap unit filters L10, H10 are used. This can reduce the circuit scale as a whole.

The apparatus for realizing the digital filter design method according to the above described first and second embodiments can be realized using any one of a hardware structure, DSP and software. For example, when the apparatus is realized by software, the filter design device can be constructed of a CPU or MPU, RAM, ROM, etc., of a computer and the device can be realized by operating a program stored in a RAM, ROM or hard disk, etc.

Therefore, the device can be realized by recording a program that causes a computer to operate so as to perform the functions of this embodiment in a recording medium such as a CD-ROM and causing the computer to read this program. As the recording medium for recording the above described program, it is possible to use a flexible disk, hard disk, magnetic tape, optical disk, magneto-optical disk, DVD, non-volatile memory card, etc., in addition to CD-ROM. Furthermore, it is also possible to realize this embodiment by downloading the above described program to a computer through a network such as the Internet.

That is, it is possible to store filter coefficients related to various types of unit filter as information in a memory such as RAM or ROM and when the user instructs an arbitrary combination related to unit filters, it is possible to allow the CPU to calculate filter coefficients corresponding to the instructed combination using the information of filter coefficients stored in the above described memory to obtain an FIR filter.

For example, it is also possible to iconize various types of unit filters (which store filter coefficients corresponding to various icons as information) and allow the user to arbitrarily combine these icons arbitrarily on a display screen and allow the CPU to automatically calculate and obtain filter coefficients corresponding to the sequence thereof. Furthermore, if the calculated filter coefficients are automatically FFT-transformed and the result is displayed as a frequency-gain characteristic, it is possible to check the designed filter characteristic and perform filter design more easily.

Here, in not only the case where the functions of the above described embodiment are realized by the computer executing a supplied program but also a case where the functions of the above described embodiment are realized by the program operating in cooperation with the OS (operating system) operating on the computer or other application software, etc., or a case where the functions of the above described embodiment are realized when the whole or part of processing of the supplied program are implemented by a function expansion board or function expansion unit of the computer, such a program is included in the embodiment of the present invention.

Other Embodiments

The above described first and second embodiment, the symmetric numerical sequence shown in FIGS. 2A and 2B is divided into two parts and used as filter coefficients of an asymmetric 3-tap unit filter, but the original symmetric numerical sequence is not limited to this. For example, it is also possible to use the symmetric numerical sequences of the 5-tap low-pass unit secondary filter L20 generated as shown in FIG. 22A or 5-tap high-pass unit secondary filter H20 generated as shown in FIG. 22B.

In the frequency-gain characteristics of these 5-tap unit secondary filters L20, H20, the cutoff characteristic is steep but has a slight rise at the shoulder (pass band). Therefore, these 5-tap unit secondary filters L20, H20 are preferably used for waveform adjustment in the final stage of the cascade connected filter blocks.

It is possible to divide the numerical sequences making up filter coefficients of the 5-tap unit secondary filters L2n, H2n having such characteristics into two parts, further adjusting one of them into filter coefficients of the 3-tap unit secondary filters L2n', H2n'. Furthermore, it is also possible to construct unit secondary filters L2n", H2n" which realize a linear phase characteristic by mirror-connecting these 3-tap unit secondary filters L2n', H2n' so as to be symmetric.

Furthermore, in addition to those shown in FIG. 2 and FIG. 22 above, it is also possible to use numerical values whose absolute values are "1" and "8", use a numerical sequence different from the above described numerical sequences as filter coefficients of a 5-tap unit filter, divide the numerical sequence into two parts and use them as filter coefficients of a 3-tap unit filter.

Furthermore, the above described embodiment has explained the example where by combining a plurality of types of unit filters, frequency bands are extracted by canceling out the respective characteristic values. In contrast, when either the central frequency Fc of a band pass filter or sampling frequency Fs of a signal can be freely determined, it is possible to simplify the filter structure by optimizing frequency extraction conditions.

Now, suppose the relationship between the central frequency Fc of the band pass filter and sampling frequency Fs of the signal is:

$$Fs=4*Fc$$

Then, when Fc=450 KHz, Fs=1.8 MHz. In the case of such a setting, it is possible to directly design a band pass filter by only cascade connecting, for example, high-pass unit filters without extracting a necessary frequency band by canceling out characteristic values which combines a low-pass unit filter and high-pass unit filter.

For example, it is possible to construct an FM band pass filter by only cascade connecting 5-tap high-pass unit filters H11 and the band width (pass band width) is adjusted by the number of connections m. This can be applied to a 3-tap high-pass unit filter H11' or high-pass unit filter H11", etc.

Furthermore, it is also possible to construct an AM band pass filter by cascade connecting a 5-tap low-pass unit filter $(L1n)^m$ after the FM band pass filter structured above. Likewise, this can also be applied to a 3-tap low-pass unit filter L11' or low-pass unit filter L11", etc.

Furthermore, it is also possible to design a high-pass filter, band pass filter, band elimination filter, etc., whose pass band is a desired frequency band by designing a relatively simple low-pass filter using the above described unit filter and shifting the pass band toward the frequency axis direction.

Generally, it is a known fact that coefficients of a band pass filter can be obtained by multiplying coefficients $H_0$, $H_1$, $H_{-1}$, $H_2$, $H_{-2}$, ... (symmetric with coefficient $H_0$ as the center) of a low-pass filter by $2\cos(m\omega_0)$. Here, $\omega_0=2\pi Fc/Fs$ (Fc is central frequency of the filter and Fs is sampling frequency of the signal), m=0, 1, −1, 2, −2, . . . .

Furthermore, it should be noted that the above described embodiments show only examples of implementing the present invention and the technical scope of the present invention should not be thereby interpreted in a limited way. That is, the present invention can be implemented in various modes without departing from the spirit or major features thereof.

INDUSTRIAL APPLICABILITY

The present invention is effectively applicable to a type of FIR digital filter provided with tapped delay lines made up of a plurality of delayers, whereby signals of the respective taps are multiplied several-fold, added up the results of multiplication and output the addition result.

What is claimed as new and desired to be protected by Letters Patent of the United States is:

1. A method of designing a digital filter which multiplies signals of taps in a tapped delay line made up of a plurality of delayers by given filter coefficients, adds up the results of multiplication, and outputs the addition result, comprising:
   carrying out a filter design using at least one of a first unit filter and a second unit filter, 0 or more said first unit filters and 0 or more said second unit filters are arbitrarily cascade connected;
   said first unit filter has basic filter coefficients of an asymmetric numerical sequence whose values are set in such a way that a total value of the numerical sequence is non-zero and that a total value of every other value in said numerical sequence equals to another total value of every other value in said numerical sequence, each having the same sign; and
   said second unit filter has basic filter coefficients of an asymmetric numerical sequence whose values are set in such a way that a total value of the numerical sequence is zero and that a total value of every other value in said numerical sequence equals to another total value of every other value in said numerical sequence, each having the opposite sign.

2. The digital filter design method according to claim 1,
   the asymmetric filter coefficients making up said first unit filter are formed by dividing a predetermined symmetric numerical sequence into two parts at the center and further adjusting one of the divided numerical sequences; and
   values of said predetermined symmetric numerical sequence are set so that a total value of the numerical sequence is non-zero and that a total value of every other value in said numerical sequence equals to another total value of every other value in said numerical sequence, each having the same sign.

3. The digital filter design method according to claim 2,
   said predetermined symmetric numerical sequence is formed in a ratio of −1, 0, 9, 16, 9, 0, −1; and
   said asymmetric filter coefficients form a numerical sequence in a ratio of −(1−N/8), 0, (9−N/8), 8 or 8, (9−N/8), 0, −(1−N/8) (N: 0≦N≦8).

4. The digital filter design method according to claim 1,
   the asymmetric filter coefficients making up said second unit filter are formed by dividing a predetermined symmetric numerical sequence into two parts at the center and further adjusting one of the divided numerical sequences; and
   values of said predetermined symmetric numerical sequence are set so that a total value of the numerical sequence is zero and that a total value of every other value in said numerical sequence equals to another total value of every other value in said numerical sequence, each having the opposite sign.

5. The digital filter design method according to claim 4,
   said predetermined symmetric numerical sequence is formed in a ratio of 1, 0, −9, 16, −9, 0, 1; and
   said asymmetric filter coefficients form a numerical sequence in a ratio of (1−N/8), 0, −(9−N/8), 8 or 8, −(9−N/8), 0, (1−N/8) (N: 0≦N≦8).

6. The digital filter design method according to claim 1,
   said first and second unit filters have, instead of said basic filter coefficients, filter coefficients comprised of numeric sequences so as that pass frequency band of a filter is adjusted by inserting delays of n clocks between taps corresponding to said basic filter coefficients.

7. A digital filter design program for causing a computer to execute processing steps related to the filter design method according to claim 1.

8. A digital filter including a tapped delay line made up of a plurality of delayers, which multiplies signals of taps by given filter coefficients, adds up the results of multiplication, and outputs the addition result;
   wherein set filter coefficients are obtained by carrying out a filter design using at least one of a first unit filter and a second unit filter, 0 or more said first unit filters and 0 or more said second unit filters are arbitrarily cascade connected;
   said first unit filter has basic filter coefficients of an asymmetric numerical sequence whose values are set in such a way that a total value of the numerical sequence is non-zero and that a total value of every other value in said numerical sequence equals to another total value of every other value in said numerical sequence, each having the same sign; and
   said second unit filter has basic filter coefficients of an asymmetric numerical sequence whose values are set in such a way that a total value of the numerical sequence is zero and that a total value of every other value in said numerical sequence equals to another total value of every other value in said numerical sequence, each having the opposite sign.

9. A method of designing a digital filter which multiplies signals of taps in a tapped delay line made up of a plurality of delayers by given filter coefficients, adds up the results of multiplication and outputs the addition result, comprising:

carrying out a filter design using at least one of a first unit filter and a second unit filter, 0 or more said first unit filters and 0 or more said second unit filters are arbitrarily cascade connected;

said first unit filter is made up of a plurality of basic filters which are cascade connected so that a numerical sequence as a whole is symmetric, wherein the plurality of basic filters have asymmetric filter coefficients of a numerical sequence whose values are set in such a way that a total value of the numerical sequence is non-zero and that a total value of every other value in said numerical sequence equals to another total value of every other value in said numerical sequence, each having the same sign; and said second unit filter is made up of a plurality of basic filters which are cascade connected so that a numerical sequence as a whole is symmetric, wherein the plurality of basic filters have asymmetric filter coefficients of a numerical sequence whose values are set in such a way that a total value of the numerical sequence is zero and that a total value of every other value in said numerical sequence equals to another total value of every other value in said numerical sequence, each having the opposite sign.

10. The digital filter design method according to claim 9, the asymmetric filter coefficients making up said first unit filter are formed by dividing a predetermined symmetric numerical sequence into two parts at the center and further adjusting one of the divided numerical sequences; and values of said predetermined symmetric numerical sequence are set so that a total value of the numerical sequence is non-zero and that a total value of every other value in said numerical sequence equals to another total value of every other value in said numerical sequence, each having the same sign.

11. The digital filter design method according to claim 10, said predetermined symmetric numerical sequence is formed in a ratio of −1, 0, 9, 16, 9, 0, −1; and said asymmetric filter coefficients form a numerical sequence in a ratio of −(1−N/8), 0, (9−N/8), 8 or 8, (9−N/8), 0, −(1−N/8) (N: 0≦N≦8).

12. The digital filter design method according to claim 9, the asymmetric filter coefficients making up said second unit filter are formed by dividing a predetermined symmetric numerical sequence into two parts at the center and further adjusting one of the divided numerical sequences; and values of said predetermined symmetric numerical sequence are set so that a total value of the numerical sequence is zero and that a total value of every other value in said numerical sequence equals to another total value of every other value in said numerical sequence, each having the opposite sign.

13. The digital filter design method according to claim 12, said predetermined symmetric numerical sequence is formed in a ratio of 1, 0, −9, 16, −9, 0, 1; and said asymmetric filter coefficients form a numerical sequence in a ratio of (1−N/8), 0, −(9−N/8), 8 or 8, −(9−N/8), 0, (1−N/8) (N: 0≦N≦8).

14. A digital filter design program for causing a computer to execute processing steps related to the filter design method according to claim 9.

15. A digital filter including a tapped delay line made up of a plurality of delayers, which multiplies signals of taps by given filter coefficients, adds up the multiplication results, and outputs the addition result;

wherein set filter coefficients are obtained by carrying out a filter design using at least one of a first unit filter and a second unit filter, 0 or more said first unit filters and 0 or more said second unit filters are arbitrarily cascade connected;

said first unit filter is made up of a plurality of basic filters which are cascade connected so that a numerical sequence as a whole is symmetric, wherein the plurality of basic filters have asymmetric filter coefficients of a numerical sequence whose values are set in such a way that a total value of the numerical sequence is non-zero and that a total value of every other value in said numerical sequence equals to another total value of every other value in, each having the same sign; and said second unit filter is made up of a plurality of basic filters which are cascade connected so that a numerical sequence as a whole is symmetric, wherein the plurality of basic filters have asymmetric filter coefficients of a numerical sequence whose values are set in such a way that a total value of the numerical sequence is zero and that a total value of every other value in said numerical sequence equals to another total value of every other value, each having the opposite sign.

16. A digital filter design device, comprising:

first unit filter storing means for storing information related to a first unit filter formed so as to multiply signals of taps in a tapped delay line made up of a plurality of delayers by filter coefficients, add up the multiplication results and output the addition result, a numerical sequence values of said filter coefficients are set so that a total value of said numerical sequence is non-zero and a total values of every other value in said numerical sequence equals to another total values of every other value in said numerical sequence, each having the same sign;

second unit filter storing means for storing information related to a second unit filter formed so as to multiply signals of taps in a tapped delay line made up of a plurality of delayers by filter coefficients, add up the multiplication results and output the addition result, a numerical sequence values of said filter coefficients are set so that a total value of said numerical sequence is zero and a total values of every other value in said numerical sequence equals to another total values of every other value in said numerical sequence, each having the opposite sign;

combining means for instructing an arbitrary combination of 0 or more said first unit filters and 0 or more said second unit filters; and filter coefficient calculating means for calculating filter coefficients corresponding to the combination specified by said combining means using the information stored by said first and second unit filter storing means.

17. The digital filter design device according to claim 16, further comprising:
  delay means for adjusting pass frequency band of a filter by inserting delays of n clocks between taps corresponding to the asymmetric filter coefficients making up said first and second unit filters.

18. A digital filter design device, comprising:
  first unit filter storing means for storing information related to a first unit filter made up of a plurality of basic filters which are cascade-connected so that a numerical sequence as a whole is symmetric, wherein the plurality of basic filters have asymmetric filter coefficients of a numerical sequence whose values are set so that a total value of the numerical sequence is non-zero and that a total value of every other value in said numerical sequence equals to another total value of every other value in said numerical sequence, each having the same sign;
  second unit filter storing means for storing information related to a second unit filter made up of a plurality of basic filters which are cascade-connected so that a numerical sequence as a whole is symmetric, wherein the plurality of basic filters have asymmetric filter coefficients of a numerical sequence whose values are set so that a total value of the numerical sequence is zero and that a total value of every other value in said numerical sequence equals to another total value of every other value in said numerical sequence, each having the opposite sign,;
  combining means for instructing an arbitrary combination of 0 or more said first unit filters and 0 or more said second unit filters; and
  filter coefficient calculating means for calculating filter coefficients corresponding to the combination specified by said combining means using the information stored by said first and second unit filter storing means.

19. The digital filter design device according to claim 18, further comprising:
  delay means for adjusting pass frequency band of a filter by inserting delays of n clocks between taps corresponding to the asymmetric filter coefficients making up said first and second unit filters.

20. A digital filter including a tapped delay line made up of a plurality of delayers, which multiplies signals of taps by given filter coefficients, adds up the multiplication results and outputs the addition result, comprising:
  said filter coefficients form an asymmetric numerical sequence whose values are set so that a total value of the numerical sequence is non-zero and a total value of every other value in said numerical sequence equals to another total value of every other value in said numerical sequence, each having the same sign.

21. The digital filter according to claim 20,
  said asymmetric filter coefficients are formed by dividing a predetermined symmetric numerical sequence into two parts at the center and further adjusting one of the divided numerical sequences; and
  values of said predetermined symmetric numerical sequence are set so that a total value of the numerical sequence is non-zero and that a total value of every other value in said numerical sequence equals to another total value of every other value in said numerical sequence, each having the same sign.

22. The digital filter according to claim 21,
  said predetermined symmetric numerical sequence is formed in a ratio of −1, 0, 9, 16, 9, 0, −1.

23. The digital filter according to claim 22,
  said asymmetric filter coefficients form a numerical sequence in a ratio of −(1−N/8), 0, (9−N/8), 8 or 8, (9−N/8), 0, −(1−N/8) (N: $0 \leq N \leq 8$).

24. The digital filter according to claim 20, comprising:
  delay means for inserting delays of n clocks between the taps corresponding to said asymmetric filter coefficients.

25. The digital filter according to claim 24,
  said delay means comprises a delay circuit which stores and outputs input data according to a second clock having a period 1/n times that of a reference clock.

26. A digital filter, comprising:
  cascade-connected basic unit filters which makes a plurality of stages, wherein the digital filter according to claim 20 or a digital filter with delays of n clocks inserted between taps corresponding to asymmetric filter coefficients according to claim 18 are used as said basic unit filters.

27. A digital filter including a tapped delay line made up of a plurality of delayers, which multiplies signals of taps by given filter coefficients, adds up the multiplication results, and outputs the addition result, comprising:
  a plurality of basic filters each comprising said tapped delay line, which are cascade connected so that a numerical sequence as a whole is symmetric, wherein the plurality of basic filters have asymmetric filter coefficients of a numerical sequence whose values are set in such a way that a total value of the numerical sequence is non-zero and that a total value of every other value in said numerical sequence equals to another total value of every other value in said numerical sequence, each having the same sign.

28. The digital filter according to claim 27,
  said asymmetric filter coefficients are formed by dividing a predetermined symmetric numerical sequence into two parts at the center and further adjusting one of the divided numerical sequences; and
  values of said predetermined symmetric numerical sequence are set so that a total value of the numerical sequence is non-zero and that a total value of every other value in said numerical sequence equals to another total value of every other value in said numerical sequence, each having the same sign.

29. The digital filter according to claim 28,
  said predetermined symmetric numerical sequence is formed in a ratio of −1, 0, 9, 16, 9, 0, −1.

30. The digital filter according to claim 29,
  said asymmetric filter coefficients form a numerical sequence in a ratio of −(1−N/8), 0, (9−N/8), 8 or 8, (9−N/8), 0, −(1−N/8) (N: $0 \leq N \leq 8$).

31. A digital filter, comprising:
  cascade-connected basic unit filters which makes a plurality of stages, wherein the digital filter according to claim 27 or a digital filter with delays of n clocks inserted between taps corresponding to asymmetric filter coefficients according to claim 27 are used as said basic unit filters.

32. A digital filter including a tapped delay line made up of a plurality of delayers, which multiplies signals of taps by given filter coefficients, adds up the multiplication results and outputs the addition result, wherein:
  said filter coefficients which form an asymmetric numerical sequence and are set so that a total value of the numerical sequence is zero and that a total value of every other value in said numerical sequence equals to another total value of every other value in said numerical sequence, each having the opposite sign.

33. The digital filter according to claim 32,
said asymmetric filter coefficients are formed by dividing a predetermined symmetric numerical sequence into two parts at the center and further adjusting one of the divided numerical sequences; and
values of said predetermined symmetric numerical sequence are set so that a total value of the numerical sequence is zero and that a total value of every other value in said numerical sequence equals to another total value of every other value in said numerical sequence, each having the opposite sign.

34. The digital filter according to claim 33,
said predetermined symmetric numerical sequence is formed in a ratio of 1, 0, −9, 16, −9, 0, 1.

35. The digital filter according to claim 34,
said asymmetric filter coefficients form a numerical sequence in a ratio of (1−N/8), 0, −(9−N/8), 8 or 8, −(9−N/8), 0, (1−N/8) (N: 0≦N≦8).

36. The digital filter according to claim 32, comprising:
delay means for inserting delays of n clocks between the taps corresponding to said asymmetric filter coefficients.

37. The digital filter according to claim 36,
said delay means comprises a delay circuit which stores and outputs input data according to a second clock having a period 1/n times that of a reference clock.

38. A digital filter, comprising:
cascade-connected basic unit filters which makes a plurality of stages, wherein the digital filter according to claim 32 or a digital filter with delays of n clocks inserted between taps corresponding to asymmetric filter coefficients according to claim 32 are used as said basic unit filters.

39. A digital filter including a tapped delay line made up of a plurality of delayers, which multiplies signals of taps by given filter coefficients, adds up the multiplication results, and outputs the addition result, comprising:
a plurality of basic filters which are cascade connected so that a numerical sequence as a whole is symmetric, wherein the plurality of basic filters have asymmetric filter coefficients of a numerical sequence whose values are set in such a way that a total value of the numerical sequence is zero and that a total value of every other value in said numerical sequence equals to another total value of every other value in said numerical sequence, each having the opposite sign.

40. The digital filter according to claim 39,
said asymmetric filter coefficients are formed by dividing a predetermined symmetric numerical sequence into two parts at the center and further adjusting one of the divided numerical sequences; and
values of said predetermined symmetric numerical sequence are set so that a total value of the numerical sequence is zero and that a total value of every other value in said numerical sequence equals to another total value of every other value in, each having the opposite sign.

41. The digital filter according to claim 40,
said predetermined symmetric numerical sequence is formed in a ratio of 1, 0, −9, 16, −9, 0, 1.

42. The digital filter according to claim 41,
said asymmetric filter coefficients form a numerical sequence in a ratio of (1−N/8), 0, −(9−N/8), 8 or 8, −(9−N/8), 0, (1−N/8) (N: 0≦N≦8).

43. A digital filter, comprising:
cascade-connected basic unit filters which makes a plurality of stages, wherein the digital filter according to claim 39 or a digital filter with delays of n clocks inserted between taps corresponding to asymmetric filter coefficients according to claim 39 are used as said basic unit filters.

44. A digital filter, comprising:
arbitrarily cascade-connected one or more basic low-pass unit filters and one or more basic high-pass unit filters,
using the digital filter according to claims 20, 27, 32, or 39, or a digital filter with delays of n clocks inserted between taps corresponding to asymmetric filter coefficients according to claims 20, 27, 32, or 39 as basic low-pass unit filters; and
using the digital filter according to claims 20, 27, 32, or 39, or a digital filter with delays of n clocks inserted between taps corresponding to asymmetric filter coefficients according to claims 20, 27, 32, or 39, as said basic high-pass unit filters.

45. The digital filter according to claim 44, further comprising:
arbitrarily cascade-connected second low-pass unit filters;
using the digital filter having said predetermined symmetric numerical sequence according to claim 21 as filter coefficients or a digital filter with delays of n clocks inserted between the taps corresponding to filter coefficients made up of said predetermined symmetric numerical sequence, as said second low-pass unit filter.

46. The digital filter according to claim 44, further comprising:
arbitrarily cascade-connected second low-pass unit filters;
using the digital filter having said predetermined symmetric numerical sequence according to claim 28 as filter coefficients or a digital filter with delays of n clocks inserted between the taps corresponding to filter coefficients made up of said predetermined symmetric numerical sequence, as said second low-pass unit filter.

47. The digital filter according to claim 44, further comprising:
arbitrarily cascade-connected second high-pass unit filters;
using the digital filter having said predetermined symmetric numerical sequence according to claim 28 as filter coefficients or a digital filter with delays of n clocks inserted between the taps corresponding to filter coefficients made up of said predetermined symmetric numerical sequence, as said second high-pass unit filter.

48. The digital filter according to claim 44, further comprising:
arbitrarily cascade-connected second high-pass unit filters;
using the digital filter having said predetermined symmetric numerical sequence according to claim 29 as filter coefficients or a digital filter with delays of n clocks inserted between the taps corresponding to filter coefficients made up of said predetermined symmetric numerical sequence, as said second high-pass unit filter.

* * * * *